(12) United States Patent
Daikoku et al.

(10) Patent No.: US 11,264,552 B2
(45) Date of Patent: Mar. 1, 2022

(54) LIGHT EMITTING DEVICE, LIGHT EMITTING MODULE, METHOD OF MANUFACTURING LIGHT EMITTING DEVICE, AND METHOD OF MANUFACTURING LIGHT EMITTING MODULE

(71) Applicant: NICHIA CORPORATION, Anan (JP)

(72) Inventors: Shinichi Daikoku, Tokushima (JP); Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/670,539

(22) Filed: Oct. 31, 2019

(65) Prior Publication Data

US 2020/0135998 A1 Apr. 30, 2020

(30) Foreign Application Priority Data

Oct. 31, 2018 (JP) .............................. JP2018-206190
Oct. 23, 2019 (JP) .............................. JP2019-192742

(51) Int. Cl.
*H01L 33/62* (2010.01)
*H01L 33/38* (2010.01)
(Continued)

(52) U.S. Cl.
CPC .............. *H01L 33/62* (2013.01); *H01L 33/38* (2013.01); *H01L 33/502* (2013.01); *H01L 33/58* (2013.01);
(Continued)

(58) Field of Classification Search
CPC ....... H01L 33/62; H01L 33/38; H01L 33/502; H01L 33/58; H01L 33/60;
(Continued)

(56) References Cited

U.S. PATENT DOCUMENTS 6,005,276 A * 12/1999 Forrest .............. H01L 31/02005
257/432
9,006,764 B2 * 4/2015 Akimoto ................. H01L 33/44
257/98

(Continued)

FOREIGN PATENT DOCUMENTS

JP 2005038776 A 2/2005
JP 2009-194319 A 8/2009
(Continued)

*Primary Examiner* — Bo B Jang
(74) *Attorney, Agent, or Firm* — Hunton Andrews Kurth LLP

(57) ABSTRACT

The light emitting device includes: a light emitting element, a covering member, a pair of electrode layers, and a pair of electrode terminals. The light emitting element has an electrode-formed surface on which a pair of electrode posts are formed. The covering member covers an electrode-formed surface of the light emitting element while forming an exposed portion of each of the pair of electrode posts which is exposed from the covering member. The pair of electrode layers are provided on a surface of the covering member and electrically connected to the exposed portions of the pair of electrode posts. The pair of electrode terminals are electrically connected to the pair of electrode layers, and provided on the surface of the covering member. The pair of electrode terminals are thicker than the pair of electrode layers, and are disposed at an interval larger than an interval between the pair of electrode posts.

20 Claims, 13 Drawing Sheets

(51) Int. Cl.
*H01L 33/50* (2010.01)
*H01L 33/58* (2010.01)
*H01L 33/60* (2010.01)

(52) U.S. Cl.
CPC ...... *H01L 33/60* (2013.01); *H01L 2933/0016* (2013.01); *H01L 2933/0058* (2013.01); *H01L 2933/0066* (2013.01); *H01L 2933/0083* (2013.01)

(58) Field of Classification Search
CPC ..... H01L 2933/0016; H01L 2933/0058; H01L 2933/0066; H01L 2933/0083; H01L 33/20; H01L 33/54; H01L 33/44
USPC .............. 257/98, 99, 100, E33.068, E33.072
See application file for complete search history.

(56) References Cited

U.S. PATENT DOCUMENTS

| | | | |
|---|---|---|---|
| 2002/0070449 A1 | 6/2002 | Yagi et al. | |
| 2005/0194605 A1* | 9/2005 | Shelton | H01L 33/62 257/99 |
| 2006/0060867 A1* | 3/2006 | Suehiro | H01L 33/56 257/81 |
| 2009/0206356 A1 | 8/2009 | Tsuchiya | |
| 2009/0309119 A1* | 12/2009 | Shinohara | H01L 33/38 257/99 |
| 2010/0051995 A1* | 3/2010 | Katsuno | H01L 33/10 257/98 |
| 2011/0297980 A1 | 12/2011 | Sugizaki et al. | |
| 2015/0129919 A1 | 5/2015 | Liu et al. | |
| 2016/0240760 A1 | 8/2016 | Huang | |
| 2016/0268471 A1 | 9/2016 | Endo et al. | |
| 2016/0276561 A1 | 9/2016 | Maki | |
| 2017/0077367 A1 | 3/2017 | Shimojuku et al. | |
| 2020/0044130 A1 | 2/2020 | Maki | |

FOREIGN PATENT DOCUMENTS

| | | |
|---|---|---|
| JP | 2011-253998 A | 12/2011 |
| JP | 2012124443 A | 6/2012 |
| JP | 2015095658 A | 5/2015 |
| JP | 2016152415 A | 8/2016 |
| JP | 2016171188 A | 9/2016 |
| JP | 2017-055093 A | 3/2017 |
| JP | 2017055038 A | 3/2017 |
| WO | WO2012141094 A1 | 7/2014 |
| WO | WO2015083365 A1 | 3/2017 |

\* cited by examiner

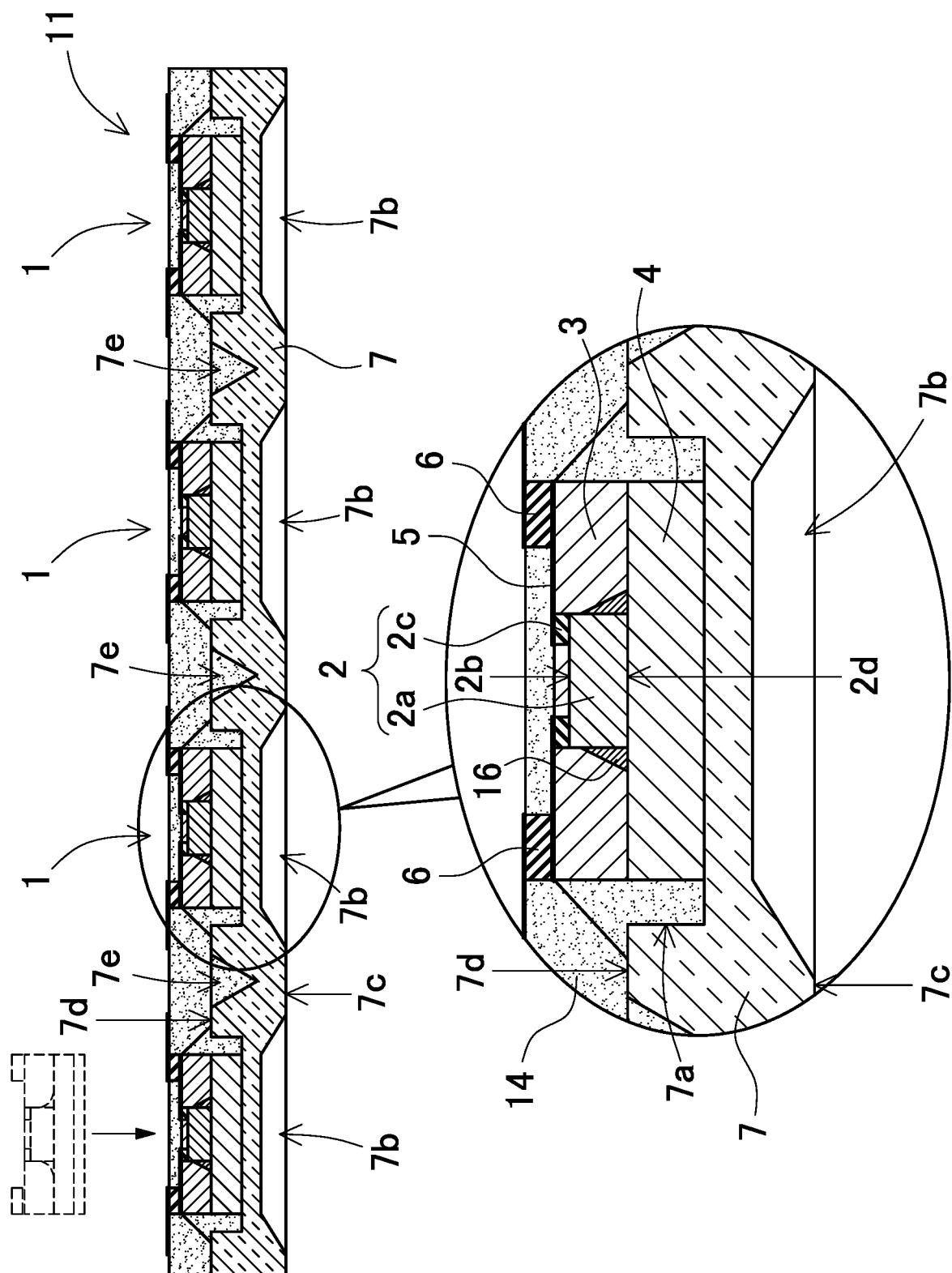

LIGHT EMITTING DEVICE, LIGHT EMITTING MODULE, METHOD OF MANUFACTURING LIGHT EMITTING DEVICE, AND METHOD OF MANUFACTURING LIGHT EMITTING MODULE

CROSS-REFERENCE TO RELATED APPLICATION

This application claims priority to Japanese Patent Application No. 2018-206190 filed on Oct. 31, 2018, and Japanese Patent Application No. 2019-192742 filed on Oct. 23, 2019, the disclosures of which are hereby incorporated by reference in their entireties.

BACKGROUND

1. Technical Field

The present disclosure relates to a light emitting device, a light emitting module in which the light emitting device is mounted, a method of manufacturing a light emitting device, and a method of manufacturing a light emitting module.

2. Description of Related Art

A light emitting device has been developed in which an electrode-formed surface of a light emitting element provided with electrode posts are covered with a covering member, and a thin electrode layer is connected to the electrode posts exposed from the covering member (see Japanese Patent Publication No. 2012-124443).

The above light emitting device is connected to the outside by the electrode layer, but the electrode layer is very thin, thus external connection is very difficult and laborious, and the light emitting device is difficult to reliably connect with stability.

The present disclosure has been made for solving the above disadvantages, and an object of the present disclosure is to provide a light emitting device which can be reliably connected to the outside with stability while the size is reduced, and a method of manufacturing the light emitting device.

SUMMARY

A light emitting device of an embodiment of the present disclosure includes: a light emitting element, a covering member, a pair of electrode layers, and a pair of electrode terminals. The light emitting element has an electrode-formed surface on which a pair of electrode posts are formed. The covering member covers an electrode-formed surface of the light emitting element while forming an exposed portion of each of the electrode posts which is exposed from the covering member. The pair of electrode layers are provided on a surface of the covering member and electrically connected to the exposed portions of the pair of electrode posts. The pair of electrode terminals are electrically connected to the pair of electrode layers, and provided on the surface of the covering member. The pair of the electrode terminals are thicker than the pair of electrode layers, and are disposed at an interval larger than an interval between the pair of electrode posts.

A light emitting module of certain embodiments of the present disclosure include the above light emitting device, and a light-transmissive light guiding plate having a second principal surface on which a recessed portion is formed on a side opposite to a first principal surface serving as a light emitting surface from which light exists. The light emitting device is disposed in the recessed portion of the light guiding plate.

A method of manufacturing a light emitting device according to an embodiment of the present disclosure includes: providing an intermediate body in which a light emitting element including a pair of electrode posts formed on an electrode-formed surface is covered with a covering member, and the covering member forms exposed portions of the pair of electrode posts exposed from the covering member; forming a pair of electrode layers on a surface of the covering member, the pair of electrode layers being electrically connected to the exposed portions of the pair of electrode posts in the intermediate body; and providing a pair of electrode terminals, which are electrically connected to the pair of the electrode layers and which are thicker than the pair of electrode layers, so as to be disposed at an interval larger than an interval between the pair of electrode posts.

Further, a method of manufacturing a light emitting module of an embodiment of the present disclosure includes: providing the light emitting device manufactured by the above mentioned method, and providing a light guiding plate having a first principal surface serving as a light emitting surface, and a second principal surface on which a recessed portion is formed, the second principal surface being positioned on a side opposite to the first principal surface; bonding the light emitting device to the recessed portion; providing a light-reflective member on the second principal surface of the light guiding plate so as to embed the light emitting device; and polishing the light-reflective member to expose the electrode terminals, and forming an electrically conductive film on surfaces of the exposed electrode terminals.

The light emitting device of the present disclosure, and a light emitting device manufactured by the method of the present disclosure can be reliably connected to the outside with stability while the size is reduced.

According to the light emitting module of the present disclosure and the method of manufacturing the light emitting module, the light emitting device can be mounted in a predetermined place on a light guiding plate and reliably connected to the outside with stability while maintaining a small size.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, in which:

FIG. 7 is a partially enlarged schematic sectional view of a light emitting module according to certain embodiment.

DESCRIPTION

Figure 1A:
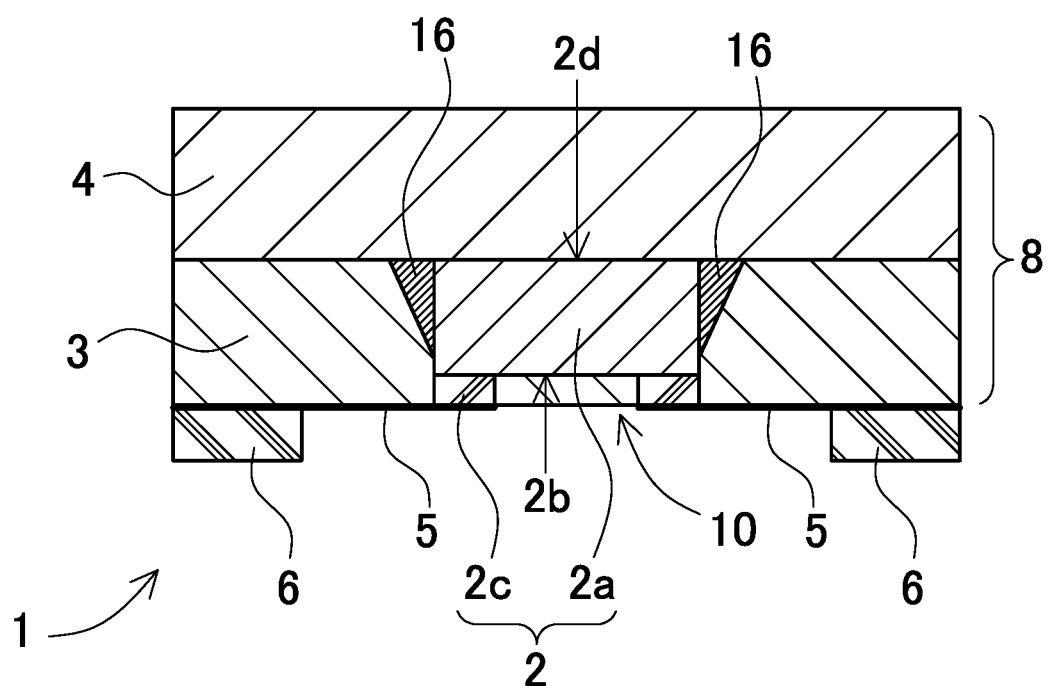
FIG. 1A is a schematic sectional view of a light emitting device according to certain embodiment.

Embodiments will now be described with reference to the accompanying drawings, wherein like reference numerals designate corresponding or identical elements throughout the various drawings. In the following descriptions, terms showing a specific direction or position (e.g. "upper", "lower" and other terms including such terms) are used as necessary, but these terms are used for ease of understanding of the disclosure by referring to the drawings, and the meaning of these terms does not limit the technical scope of the present disclosure. In addition, parts or members with the same reference numeral in a plurality of drawings represent the same or equivalent parts or members.

Further, embodiments described below are intended to give specific examples of the technical idea of the present disclosure, and do not limit the present disclosure to the following embodiments. In addition, unless otherwise specified, the dimensions, materials, shapes, relative arrangements and so on of components described below are not intended to limit the scope of the present disclosure thereto, but are intended to give examples. In addition, details described in certain embodiment or example is also applicable to other embodiments or examples. In addition, the sizes, positional relations and so on of members shown in the drawings may be exaggerated for clarification of explanation.

A light emitting device includes: a light emitting element having an electrode-formed surface on which a pair of electrode posts are formed; a covering member covering the electrode-formed surface of the light emitting element while forming an exposure portion of each of the electrode posts which is exposed from the covering member; a pair of electrode layers provided on a surface of the covering member and electrically connected to the exposure portions of the electrode posts; and a pair of electrode terminals electrically connected to the electrode layers and provided on the surface of the covering member. A pair of electrode terminals is thicker than the electrode layer, and is disposed at an interval larger than an interval between the pair of electrode posts.

First Embodiment

Figure 1B:
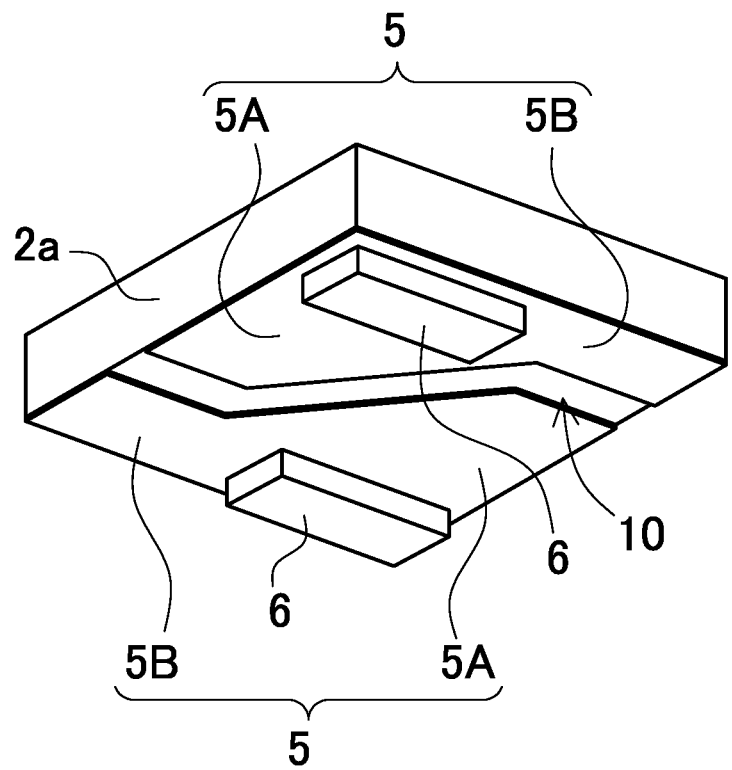
FIG. 1B is a schematic perspective view of a light emitting device according to certain embodiment, where the light emitting device is seen from the oblique lower side.
Figure 1C:
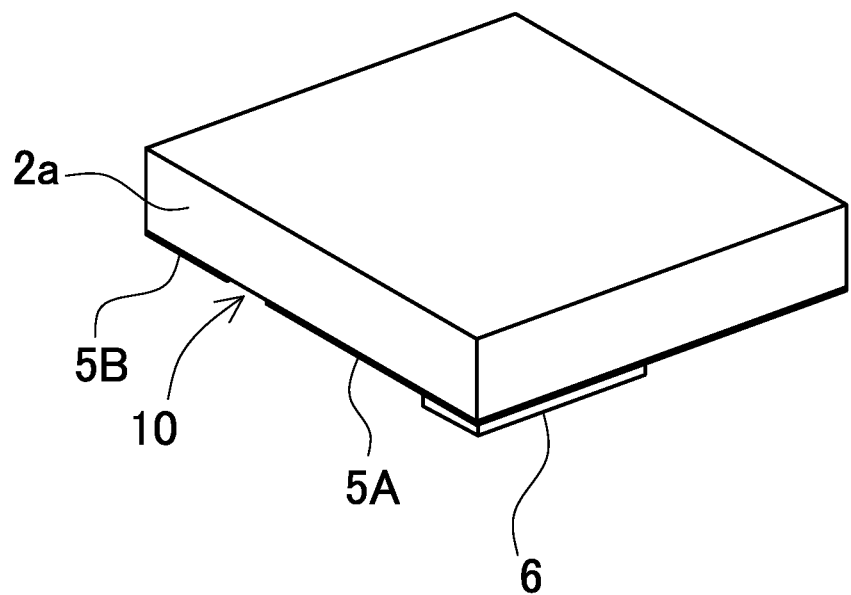
FIG. 1C is a schematic perspective view of a light emitting device according to certain embodiment, where the light emitting device is seen from the oblique upper side.

A light emitting device 1 according to a first embodiment is shown in a sectional view of FIG. 1A, a perspective view of FIG. 1B where the light emitting device 1 is seen from the oblique lower side (i.e., oblique lower side in FIG. 1A), and a perspective view of FIG. 1C where the light emitting device 1 is seen from the oblique upper side (i.e., oblique upper side in FIG. 1A). The light emitting device 1 includes a light emitting element 2, a covering member 3, a light-transmissive member 4, at least an electrode layer 5 and at least an electrode terminal 6. The light emitting element 2 includes a layered structural body 2a in which semiconductor layers are stacked; and a pair of electrode posts 2c formed on an electrode-formed surface 2b which is one surface of the layered structural body 2a (i.e., lower surface in FIG. 1A). The light emitting device 1 radiates light upward in the sectional view of FIG. 1A.

The light emitting element 2 includes a semiconductor layered structural body 2a. The layered structural body 2a includes a light emitting layer, an n-type semiconductor layer and a p-type semiconductor layer with the light emitting layer sandwiched therebetween, and has n-side and p-side electrode posts 2c provided on the electrode-formed surface 2b. The longitudinal, lateral and height dimensions of the light emitting element 2 are not particularly limited, but it is preferable to use the layered structural body 2a having longitudinal and lateral dimensions of 1000 μm or less in a top view, it is more preferable to use the layered structural body 2a having longitudinal and lateral dimensions of 500 μm or less in a top view, and it is still more preferable to use the layered structural body 2a having longitudinal and lateral dimensions of 200 μm or less in a top view. Using such a light emitting element 2 can achieve a high-definition image at the time of performing local dimming of a liquid crystal display device. Using the light emitting element 2 having longitudinal and lateral dimensions of 500 μm or less can lower the cost itself, and therefore the cost of the light emitting module can be lowered. The light emitting element 2 having longitudinal and lateral dimensions of 250 μm or less has the small surface area of a light emitting surface 2d of the light emitting element 2, so that the amount of light emitted from lateral surfaces of the light emitting element 2 becomes relatively large. That is, such a light emitting element 2 is likely to emit light having a batwing shape light distribution, and is therefore preferably used for the light emitting module of this embodiment in which the light emitting element 2 is bonded to the light guiding plate, and there is a very short distance between the light emitting element 2 and the light guiding plate.

The covering member 3 is provided so as to cover the electrode-formed surface 2b and the lateral surfaces of the light emitting element 2 such that surfaces of a pair of electrode posts 2c are exposed. The covering member 3 is provided in the periphery of the light emitting element 2 to embed the light emitting element 2, although the electrode posts 2c of the light emitting element 2 is exposed from the surface of the covering member 3. The outer peripheral surface of the covering member 3 is flush with the outer peripheral surface of the light-transmissive member 4, so that the covering member 3 is in contact with the light-transmissive member 4. The covering member 3 is bonded to the light emitting element 2 and the light-transmissive member 4 as an integral structure to provide the light emitting device 1.

The covering member 3 is preferably a resin member mainly containing a polymer such as, for example, a silicone resin, a silicone modified resin, an epoxy resin or a phenol resin. The covering member 3 is preferably a light-reflective resin member. The light-reflective resin means a resin material having a reflectivity of 70% to light from the light emitting element 2. For example, a white resin or the like is preferable. Light reaching the covering member 3 is reflected, and travels toward the light extracting surface of the light emitting device 1, thus the light extraction efficiency of the light emitting device 1 can be enhanced. In the case of a shape such as that of an intermediate body 8, the covering member 3 is preferably a light-transmissive resin member. In such a case, the covering member 3 may be formed using the same material as that of the later-described light-transmissive member 4.

The light-transmissive member 4 is provided so as to cover the light emitting surface 2d of the light emitting element 2, and transmits light emitted from the light emitting surface 2d. In FIG. 1A, the light emitting surface 2d is an upper, which is a surface opposite to the electrode-formed surface 2b on which the electrode post 2c is formed. The light-transmissive member 4 contains a fluorescent material as described later, so that the color of light emitted from the light emitting element 2 can be adjusted, followed by radiating the light. The light-transmissive member may include a plurality of layers.

For the light-transmissive member 4, a light-transmissive resin, glass or the like can be used. In particular, a light-transmissive resin is preferable, and a polymer such as a silicone resin, a silicone modified resin, an epoxy resin or a phenol resin, or a thermoplastic resin such as a polycarbonate resin, an acrylic resin, a methyl pentene resin or a polynorbomene resin can be used. It is especially preferable to use a silicone resin, which is highly resistant against heat and light.

The light-transmissive member 4 may contain a fluorescent material. As the fluorescent material, one that can be excited by light emitted from the light emitting element is used. Examples of the fluorescent material that can be excited by a blue light emitting element or an ultraviolet light emitting element include yttrium-aluminum-garnet-based fluorescent materials activated with cerium (YAG: Ce), lutetium-aluminum-garnet-based fluorescent materials activated with cerium (LAG: Ce); nitrogen-containing aluminosilicate calcium-based fluorescent materials activated with europium and/or chromium ($CaO-Al_2O_3-SiO_2$); silicate-based fluorescent materials activated with europium (($Sr, Ba)_2SiO_4$); nitride-based fluorescent materials such as β-sialon-based fluorescent materials, CASN-based fluorescent materials, SCASN-based fluorescent materials; KSF-based fluorescent materials ($K_2SiF_6$: Mn); and sulfide-based fluorescent materials and quantum dot fluorescent materials. By combining these fluorescent materials with a blue light emitting element or an ultraviolet light emitting element, the light emitting devices 1 of various colors (e.g., white color light emitting device 1) can be provided.

In addition, the light-transmissive member 4 may contain various fillers for the purpose of, for example, adjusting the viscosity.

Figure 1D:
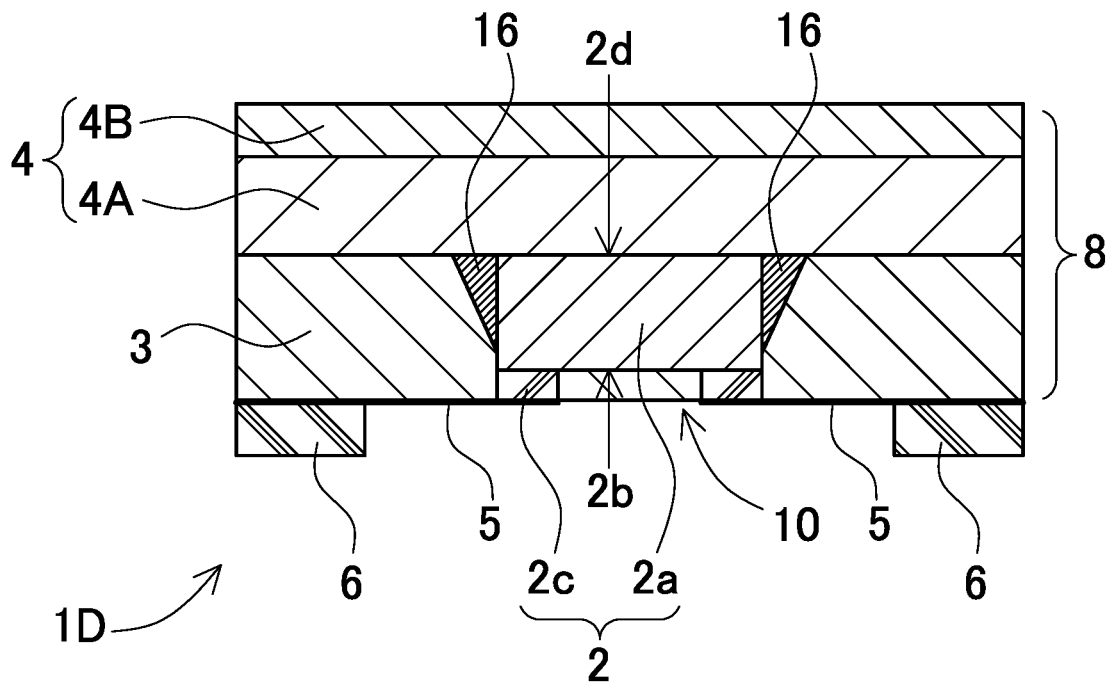
FIG. 1D is a schematic sectional view of a light emitting device according to another embodiment.

A modification of the light-transmissive member 4 may be employed. For example, the present modification is shown in FIG. 1D. FIG. 1D is a sectional view showing the modification of the light-transmissive member 4 in a light emitting device 1D. In FIG. 1D, the light-transmissive member 4 includes a first light-transmissive member 4A, and a second light-transmissive member 4B covering a radiating surface of the first light-transmissive member 4A (In FIG. 1D, the radiating surface is an upper surface, which is a surface on a side opposite to the light emitting element 2). The first light-transmissive member 4A is bonded to the light emitting surface 2d of the light emitting element 2 to transmit light emitted from the light emitting surface 2d of the light emitting element 2. The first light-transmissive member 4A may contain a fluorescent material. The second light-transmissive member 4B is a light diffusion portion which diffuses transmitted light. In the light-transmissive member 4, the first light-transmissive member 4A and the second light-transmissive member 4B are bonded to each other, with the first light-transmissive member 4A positioned on the light emitting surface side. The light-transmissive member may be one in which a plurality of first light-transmissive members and second light-transmissive members is stacked.

Figure 1E:
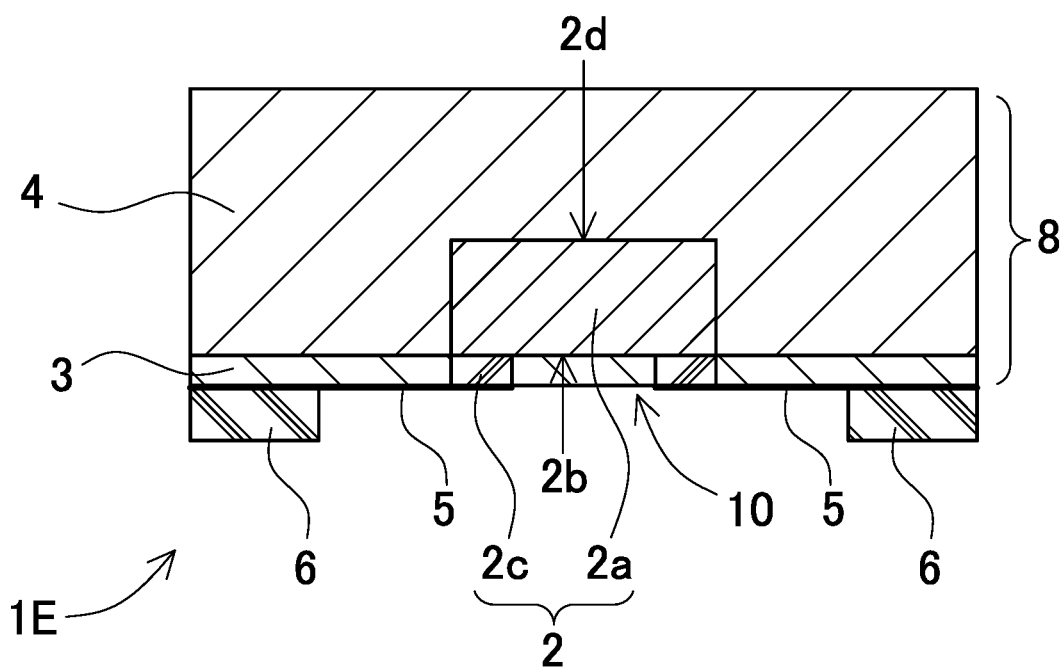
FIG. 1E is a schematic sectional view of a light emitting device according to another embodiment.

Another modification of the light-transmissive member 4 may be employed. For example, FIG. 1E is a sectional view showing the present modification of the light-transmissive member 4. FIG. 1E shows a light emitting device 1E in which the light-transmissive member 4 covers the light emitting surface 2d and latera surfaces of the layered structural body 2a, and transmits light exited from the light emitting surface 2d and latera surfaces of the layered structural body 2a. On the upper surface of the light-transmissive member 4, a light diffusion portion may be provided.

In FIG. 1E, the covering member 3 covers the lateral surfaces of the electrode posts 2c and the electrode-formed surface 2b opposite to the upper surface of the light-transmissive member 4 (In FIG. 1E. the lower surface thereof) such that at least a portion of the surface of the each of a pair of electrode posts 2c. The outer periphery of the covering member 3 is flush with and in contact with the outer periphery of the light-transmissive member 4. The covering member 3 is bonded to the light emitting element 2 and the light-transmissive member 4 as an integral structure to provide the light emitting device 1.

A pair of electrode layers 5 is electrically connected to a pair of electrode posts 2c, respectively. Each electrode layer 5 has an area larger than the area of each electrode post 2c. In other words, the electrode layers 5 are provided so as to continuously cover the electrode posts 2c of the light emitting element 2 and the covering member 3.

The electrode terminals 6 are each stacked on the surface of the electrode layer 5, and electrically connected to the corresponding electrode layer 5. The electrode terminals 6 are thicker than the electrode layer 5, and are disposed at an interval larger than an interval between a pair of electrode posts 2c. The electrode terminals 6 having larger interval can be connected to the outside with less occurrence of an adverse effect such as a short-circuit between terminals, and the light emitting device 1 having thick electrode terminals 6 can be reliably electrically connected to the outside with stability.

As shown in FIG. 1A, a light-transmissive adhesion member 16 covers at least a portion of lateral surfaces of the light emitting element 2 and at least a portion of the light-transmissive member 4. The outer lateral surfaces of the light-transmissive adhesion member 16 are preferably inclined surfaces outwardly extending from the lateral surfaces of the light emitting element 2 toward the light-transmissive member 4, more preferably a curved surface projected to the light emitting element 2 side. This ensures that a larger amount of light from the lateral surfaces of the light emitting element 2 can be guided to the light-transmissive member 4, so that light extraction efficiency can be enhanced.

The light-transmissive adhesion member 16 may be present between the light emitting surface 2d of the light emitting element 2 and the light-transmissive member 4. Accordingly, for example, when the light-transmissive adhesion member 16 contains a diffusing agent or the like, light from the light emitting surface 2d of the light emitting element 2 is diffused at the light-transmissive adhesion member 16, and enters the light-transmissive member 4, so that luminance non-uniformity can be reduced. For the light-transmissive adhesion member 16, a member identical to a light-transmissive bonding member 12 as described later can be used.

The light emitting device 1 can be formed by the following steps.

(1) a step of providing the intermediate body 8 which includes the light emitting element 2 including a pair of electrode posts 2c on the electrode-formed surface 2b, and the covering member 3 covering the light emitting element 2 such that a portion of the surface of each of the electrode posts 2c is exposed.

(2) a step of forming a metal layer 9 which is electrically connected to a pair of exposed electrode posts 2c, and continuously covers the electrode posts 2c and the covering member 3;

(3) a division step performed by irradiating the metal layer 9 with laser light to remove part of the metal layer 9, so that the metal layer 9 is separated to form a pair of electrode layers 5 which is separated from each other, and respectively has areas larger than the areas of a pair of electrode posts 2c; and (4) an electrode forming step of providing a pair of electrode terminals 6, which is electrically connected to a pair of electrode layers 5 and which is thicker than the electrode layer 5, so as to be disposed at an interval larger than an interval between a pair of electrode posts 2c.

Hereinafter, a process of manufacturing a light emitting device will be described with reference to FIGS. 2A to 2E.

Step of Providing Intermediate Body

Figure 2A:
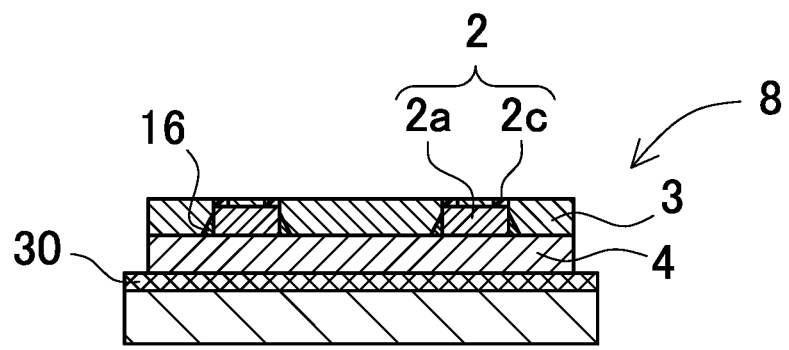
FIGS. 2A to 2E are schematic sectional view showing stacking steps of manufacturing the light emitting device in FIG. 1A.

As shown in FIG. 2A, the intermediate body 8 including the light emitting element 2 and the covering member 3 is provided. The light emitting element 2 includes the layered structural body 2a, and a pair of electrode posts 2c on a surface close to the surface on which the layered structural body 2a is present. The covering member 3 covers the light emitting element 2 such that a portion of each of a pair of electrode posts 2c is exposed. One intermediate body 8 includes a plurality of light emitting elements 2, and the light emitting elements 2 are integrally covered with the covering member 3 in a state of being arranged regularly in longitudinal and lateral directions. In drawings illustrating the steps (e.g., FIGS. 2A to 2E), two light emitting elements 2 are shown for the sake of convenience of explanation, but the number of light emitting elements 2 is not required to be two.

The distance between the light emitting elements 2 can be appropriately determined according to the size of the desired light emitting device 1, the size of the light emitting elements 2. It should be noted that in a method including cutting the covering member 3 into a plurality of light emitting devices 1 in the following step, the light emitting elements are arranged with consideration given to the width of the cut portion (i.e., width of cutting blade) and the like.

In addition, FIG. 2A shows the intermediate body 8 having the light-transmissive member 4 on the lower surface of the light emitting element 2 (i.e., the light emitting surface 2d, which opposes the electrode-formed surface 2b). It should be noted that the light-transmissive member 4 is not necessarily disposed, and may be omitted. The intermediate body 8 is mounted on a support member 30 in such a manner that a surface on which the electrode post 2c is not formed (i.e., surface on which the light-transmissive member 4 is formed in FIG. 2A) faces the support member 30.

Step of Forming Metal Layer 9

Figure 2B:
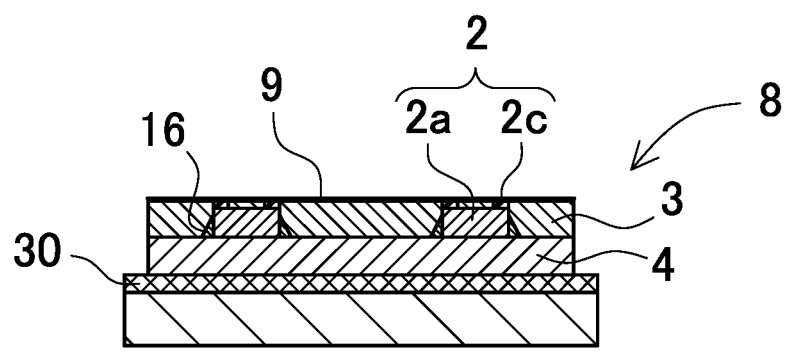

Subsequently, as shown in FIG. 2B, a metal layer 9 continuously covering a pair of exposed electrode posts 2c and the covering member 3. The metal layer 9 can be formed by sputtering, vapor deposition, an atomic layer deposition (ALD) method, a metal organic chemical vapor deposition (MOCVD) method, a plasma CVD 'Plasma-enhanced chemical vapor deposition (PECVD) method, an atmospheric plasma-enhanced deposition method or the like.

Preferably, the outermost surface layer of the metal layer 9 is formed of, for example, a platinum group element metal such as Au or Pt. Au having favorable solderability can be used for the outermost surface.

The metal layer 9 may include only one layer of a single material, or may be formed by stacking layers of different materials. In particular, it is preferable to use the metal layer 9 having a high melting point. Examples of the material for the metal layer 9 include Ru, Mo and Ta. Such a metal having a high melting point may serve as a diffusion preventing layer by being provided between the electrode post 2c and the outermost surface layer of the light emitting element 2. The diffusion preventing layer can alleviate a situation in which Sn contained in solder is diffused to the electrode post 2c or a layer close to the electrode post 2c. Examples of the layered structure including such a diffusion preventing layer include structures of Ni/Ru/Au and Ti/Pt/Au. The thickness of the diffusion preventing layer (e.g. Ru) is preferably about 10 Å to 1000 Å.

The thickness of the metal layer 9 can be selected in various ways. The thickness of the metal layer 9 may be such a thickness that laser abrasion selectively occurs, and for example, the thickness is preferably 1 μm or less, more preferably 1000 Å or less. The thickness of the metal layer 9 is preferably a thickness enabling alleviation of corrosion of the electrode post 2c, for example 5 nm or more. In the present disclosure, when the metal layer 9 is formed by stacking a plurality of layers, the thickness of the metal layer 9 is the total thickness of the plurality of layers.

Step of Removing Part of Metal Layer 9

Figure 2C:
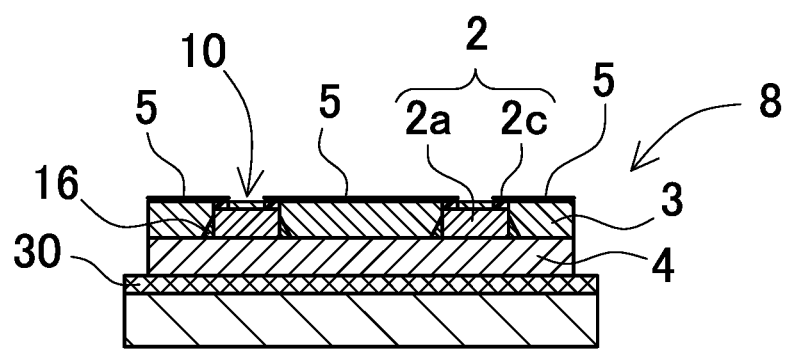
Figure 3:
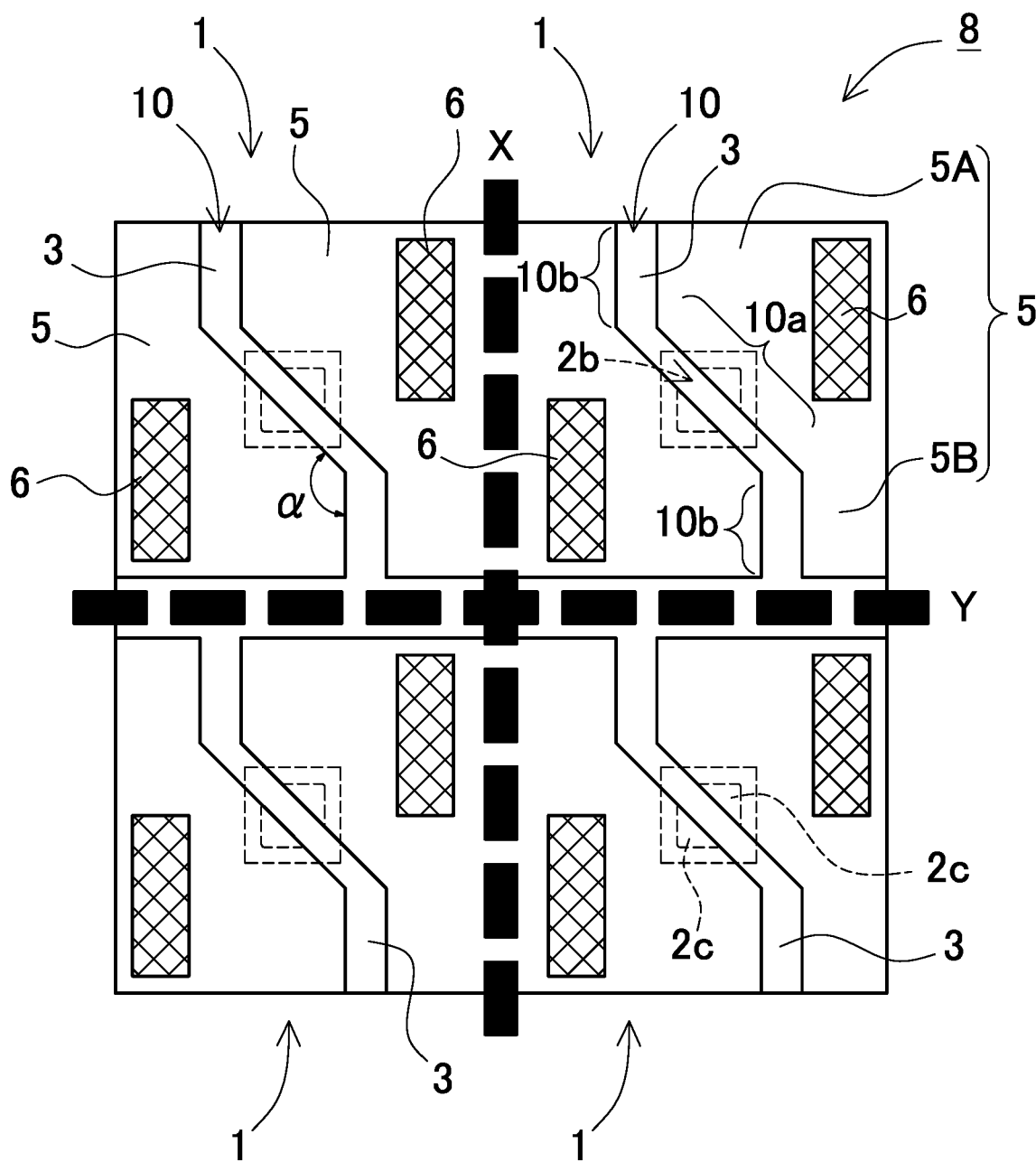
FIG. 3 is a schematic top view of a light emitting device according to certain embodiment.

As shown in FIG. 2C, an inter-electrode slit at which substantially no metal layer 9 (i.e., electrode layer 5) is present is created as an insulating region 10 by irradiating the metal layer 9 with laser light. The insulating region 10 created between a pair of electrode posts 2c of the light emitting element 2 is irradiated with the laser light. The plan view of FIG. 3 shows the insulating regions 10 created between the electrode layers 5. The insulating region 10 extends not only between a pair of electrode posts 2c of the light emitting element 2, but also to each of surfaces of the covering member 3 in the extension thereof, so that the metal layer 9 is divided.

The insulating region 10 of the inter-electrode slit has a width substantially equal to a width between the electrode posts 2c of the light emitting element 2. In the light emitting device 1 in FIG. 3, the width of the insulating region 10 is slightly larger than the width of the electrode post 2c. In the insulating region 10, the metal layer 9 is removed by laser abrasion. The metal layer 9 is removed in the insulating region 10 such that the covering member 3 in a slit shape is exposed between a pair of electrode posts 2c of the light emitting element 2.

The metal layer 9 can be irradiated with the laser light by continuously or sequentially moving the irradiation spot of the laser light on the member. The metal layer 9 may be irradiated with the laser light continuously or in a pulsed manner. The intensity of the laser light, the diameter of the irradiation spot and the moving speed of the irradiation spot can be set so that laser abrasion occurs in the metal layer 9 on the covering member 3 with consideration given to the thermal conductivities of the covering member 3 and the metal layer 9 and the difference in thermal conductivities between the covering member 3 and the metal layer 9.

For the wavelength of laser light, it is preferable to select a wavelength at which the reflectivity at the metal layer 9 is low, for example 90% or less. For example, the outermost surface of the metal layer 9 is formed using Au, it is preferable to use laser light having an emission wavelength shorter than that in a green region (e.g. 550 nm) rather than laser light having a wavelength in a red region (e.g. 640 nm). This ensures that abrasion can be caused to occur efficiently, leading to enhancement of mass productivity.

In the light emitting device 1 shown in the plan view of FIG. 3, the intermediate body 8 including a plurality of light emitting elements 2 is used. Therefore as shown in FIG. 2C and FIG. 3, the metal layer 9 is divided between a pair of electrode posts 2c of one light emitting element 2 by laser light irradiation to remove part of the metal layer 9, but connects with the metal layer 9 covering the electrode posts 2c of adjacent light emitting elements 2. In the intermediate body 8 in FIG. 3, the metal layer 9 is cut between adjacent light emitting elements along the cut line indicated by broken line X in FIG. 2E to divide the metal layer 9 into electrode layers 5 in a step of separating the intermediate body 8 into light emitting devices as described later. In a division step of forming an inter-electrode slit, cut lines X and Y between light emitting elements are also irradiated with laser light to make the metal layer 9 into mutually independent electrode layers 5 only by laser irradiation.

In the intermediate body 8 in FIG. 3, the metal layer 9 is removed in a slit shape with laser light to create the insulating region 10, and a pair of electrode layers 5 is formed at both sides of the insulating region 10. In the intermediate body 8 in this drawing, the insulating region 10 of the inter-electrode slit includes an inclined slit 10a and parallel slits 10b. The inclined slit 10a is formed at the central portion of the electrode-formed surface 2b of the light emitting element 2 while extending in a diagonal direction of the electrode-formed surface 2b. The parallel slits 10b are respectively connected to both end portions of the inclined slit 10a. The parallel slits 10b provided at both end portions are parallel to each other, and extend in a direction parallel to two opposed sides of the electrode-formed surface 2b. In the light emitting device 1 in FIG. 3, edges facing each other of a pair of electrode posts 2c on the electrode-formed surface 2b are positioned in a diagonal direction of the quadrangle electrode-formed surface 2b, and the inclined slit 10a is provided parallel to the opposed edges. That is, the insulating region 10 is created between the electrode layers 5 with the inclined slit 10a being parallel to the opposed edges of the electrode post 2c.

In the intermediate body 8 in FIG. 3, the electrode post 2c slightly protrudes into the insulating region 10 of the electrode layer 5, and the width of the inclined slit 10a provided in each light emitting device 1 is slightly larger the distance between the electrode posts 2c. The connection angle (a) formed by the inclined slit 10a and the parallel slit 10b is an obtuse angle, a pair of electrode layers 5 including a wide portion 5A and a narrow portion 5B is provided on both sides of the insulating region 10 of the inter-electrode slit, and a pair of electrode layers 5 is provided on both opposed sides (both left and right sides in the drawing) of the insulating region 10.

Step of Forming Electrode Terminal 6

Figure 2D:
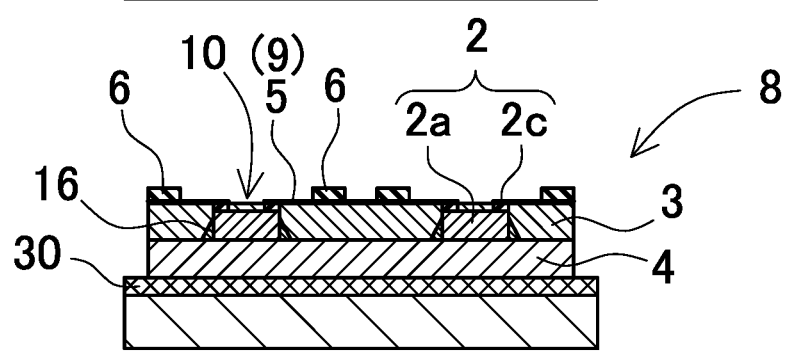

The step in FIG. 2D includes applying an electrically conductive paste to the surface of the metal layer 9 to provide the electrode terminals 6. The electrically conductive paste may be obtained by mixing metal powder with a binder, and the binder is applied with a uniform thickness on the surface of the metal layer 9 in the form of an uncured liquid or paste. In the electrically conductive paste applied to the surface of the metal layer 9, the binder is cured to form the electrically conductive electrode terminal 6 in a state of being electrically connected to the metal layer 9. The electrically conductive paste may be obtained by, for example, mixing silver or copper powder as metal powder with a polymer as a binder, and the polymer as a binder is cured to form the electrically conductive electrode terminals 6. An electrically conductive paste formed using an ultraviolet ray-curable resin or a photocurable resin as a binder can be irradiated with an ultraviolet ray or light with a specific wavelength after being applied to cure the binder in a short time. The electrically conductive paste is applied to a specific position on the electrode-formed surface 2b using a metal mask. On the metal mask, through-holes are formed at positions where the electrode terminals 6 are to be provided. The electrically conductive paste is applied with the metal mask stacked on the electrode-formed surface 2b, and the electrically conductive paste is applied to a position where the electrode terminals 6 are provided. The applied electrically conductive paste is irradiated with an ultraviolet ray or light, and thus the electrically conductive paste is cured in a short time to form the electrode terminals 6. In this method, the thickness of the electrode terminals 6 can be adjusted by the thickness of the metal mask. This is because the electrically conductive paste supplied in the through-holes of the metal mask is cured to form the electrode terminals 6.

Step of Separating Individual Light Emitting Devices

Figure 2E:
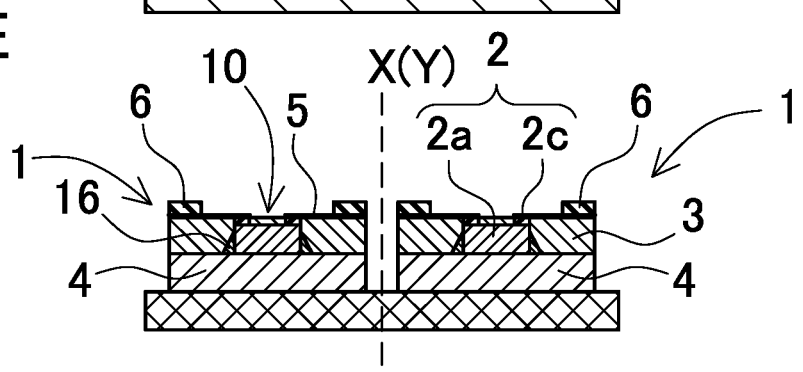

The intermediate body 8 including a plurality of light emitting devices 1 is provided with the electrode terminals 6, and thereafter cut along cut lines X and Y to be separated into individual light emitting devices 1 as shown in FIGS. 2E and 3. The separated light emitting devices 1 are mounted on a light guiding plate to configure a light emitting module.

In the obtained light emitting device 1, the metal layer 9 is provided as the electrode layer 5. The electrode layer 5 is connected to each of a pair of electrode posts 2c of the light emitting device 1, and has an area larger than that of a pair of post electrodes 2c. In addition, the electrode layer 5 obtained by cutting the metal layer 9 is formed so as to extend to the end portion of the light emitting device 1, in other words, to extend to the lateral surface of the light emitting device 1. This ensures that the electrode layer 5 having a larger area can be obtained.

The electrode terminals 6 are thicker than the metal layer 9. The thickness of the electrode terminals 6 is, for example, not less than 10 times the thickness of the metal layer 9. The thickness of the electrode terminals 6 is adjusted by the thickness of the electrically conductive paste applied. The electrode terminals 6 are provided in a state of being stacked on the thin metal layer 9. The metal layer 9 having a thickness of, for example, about 500 angstroms can be removed by laser light with reduced damage to the covering member 3.

In the light emitting device 1, the thick electrode terminals 6 may be provided in a state of being stacked on the electrode layer 5. In such a case, the electrode terminals 6 can be reliably connected to the outside with stability. The thickness of the electrode terminals 6 stacked on the electrode layer 5 is, for example, preferably at least 10 μm, more preferably in a range of 20 μm to 40 μm. In a step of mounting the light emitting device 1 on a light guiding plate or the like, a light-reflective member of plastic or the like is stacked on the light emitting device 1, and the light emitting device 1 is electrically connected to an electrically conductive film. The surface of the light-reflective member is polished or ground, so that the electrode terminals 6 are exposed to be flush with the light-reflective member, and in this state, the electrode terminals 6 are electrically connected to the electrically conductive film. In the step of polishing the surface of the light-reflective member, the electrode terminals 6 are exposed to be flush with the light-reflective member, portions of the surfaces of the electrode terminals 6 are also removed. The thick electrode terminal 6 is less likely to be broken in the step of polishing the light-reflective member, and portions of the surfaces of the electrode terminals 6 can be polished to be flush with the light-reflective member.

If the light emitting device includes no electrode terminal 6, it is very difficult to polish a light-reflective member in a state where the light emitting device is mounted on a light guiding plate. This is because extremely high polishing accuracy is required to expose the thin electrode layer 5 embedded in a light-reflective member without damaging the layer. The thickness of the thin electrode layer 5 may be about 500 angstroms, for example.

The electrode terminals 6 to be disposed on the surfaces of the electrode layers 5 each having an area larger than that of the electrode post 2c can be formed on the surfaces of the electrode layers 5 with an area larger than that of the electrode post 2c and at an interval larger than that of the electrode posts 2c. The electrically conductive paste can be applied in a specific shape to a specific position on the surface of the electrode layer 5 to form the electrode terminal 6. The surface of the electrode layer 5 is masked, so that the electrically conductive paste is applied to a specific region.

The light emitting device 1 in FIG. 1A has the electrode terminal 6 disposed on each of both sides of the slit-shaped insulating region 10. The electrode terminal 6 is elongated in the extending direction of the parallel slit 10b. The light emitting device 1 includes the rectangular electrode terminals 6 disposed parallel to the parallel slits 10b on each of both lateral portions of the wide portion 5A of the electrode layer 5. In the light emitting device 1, a pair of electrode terminals 6 is disposed separately from each other at symmetric positions on the outer edge of the quadrangular electrode-formed surface 2b, so that the electrode terminals 6 can be disposed at an interval significantly larger than the interval between the electrode posts 2c, and electrode terminals 6 significantly larger in size than the electrode posts 2c can be provided. The light emitting device 1 may include electrode terminals 6 which are disposed at an interval larger than the interval between the electrode posts 2c, and which are larger in size than the electrode posts 2c and larger in thickness than the electrode layers 5. Such a light emitting device 1 can be reliably electrically connected to an electrically conductive film in the step of mounting the light emitting device 1 at a specific position to obtain a light emitting module.

Modification 1

Figure 4:
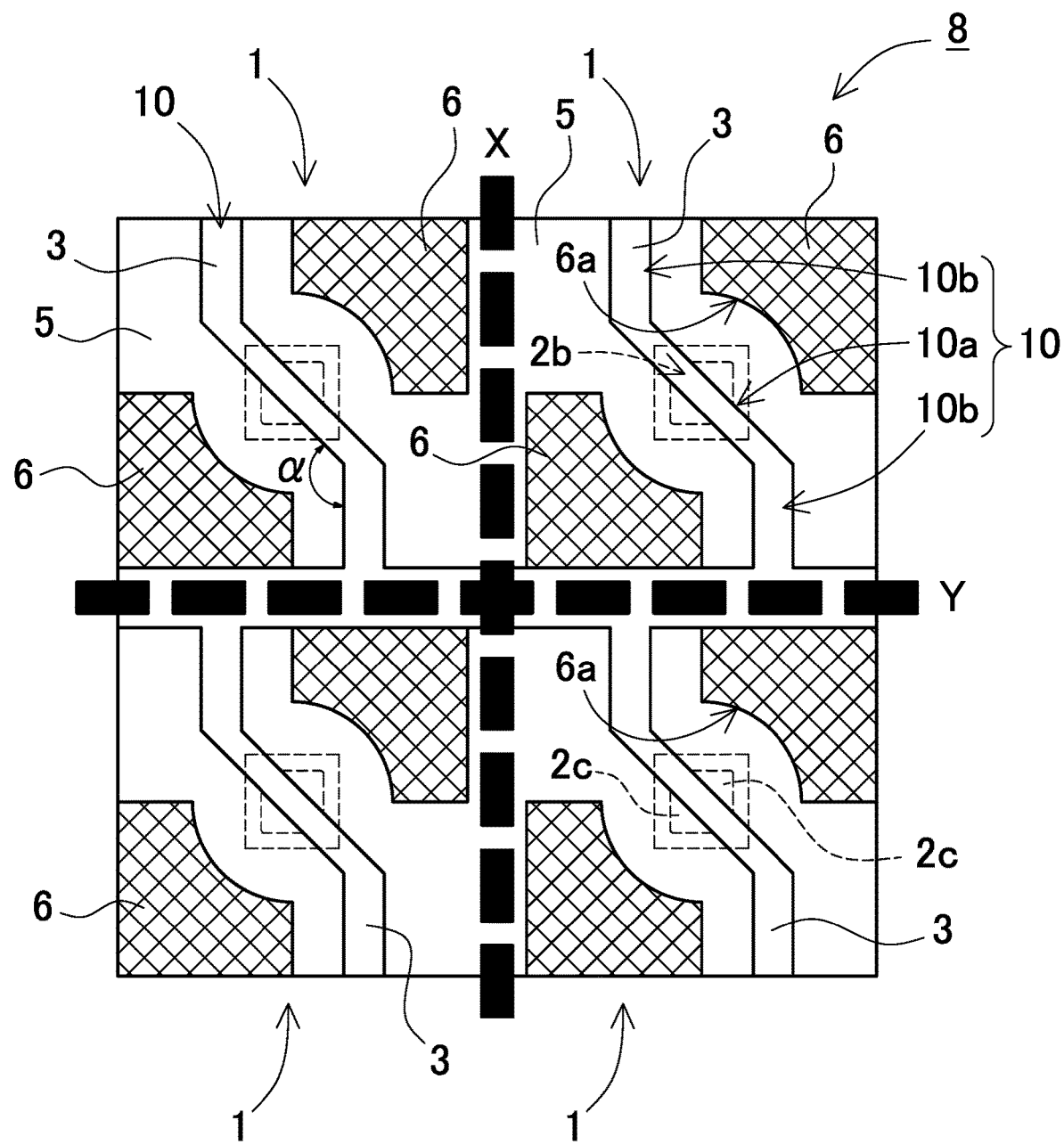
FIG. 4 is a schematic top view of a light emitting device according to another embodiment.

FIG. 4 shows a light emitting device 1 according to a first modification. The light emitting device 1 herein is a modification having the same structure as in the first embodiment except for the shape and the position of electrode terminals 6. The light emitting device 1 of the first embodiment includes long and narrow rectangular electrode terminals 6 disposed parallel to a parallel slits 10b at positions symmetric with respect to a point on an electrode-formed surface 2b, whereas the electrode terminals 6 in the light emitting device 1 is positioned in opposed corner portions of a quadrangular covering member 3, and exclude the central portion of the covering member 3. Specifically, electrode terminals 6 are respectively disposed at two corners at positions symmetric with respect to a point on the quadrangular electrode-formed surface 2b. The outer shape of the electrode terminal 6 is a quadrangular shape with a recess 6a created at one corner portion, and a pair of recesses 6a in one light emitting device 1 face each other. The electrode post 2c are disposed between the recesses 6a facing each other of a pair of electrode terminals 6. The electrode terminals 6 each have two outer edges positioned on the outer edges of the covering member 3. The electrode terminal 6 can be disposed at a corner portion of the covering member 3 with a large area. Therefore, the electrode terminal 6 is larger in size than the electrode post 2c, and larger in size than the electrode-formed surface 2b.

Second Embodiment

Figure 5:
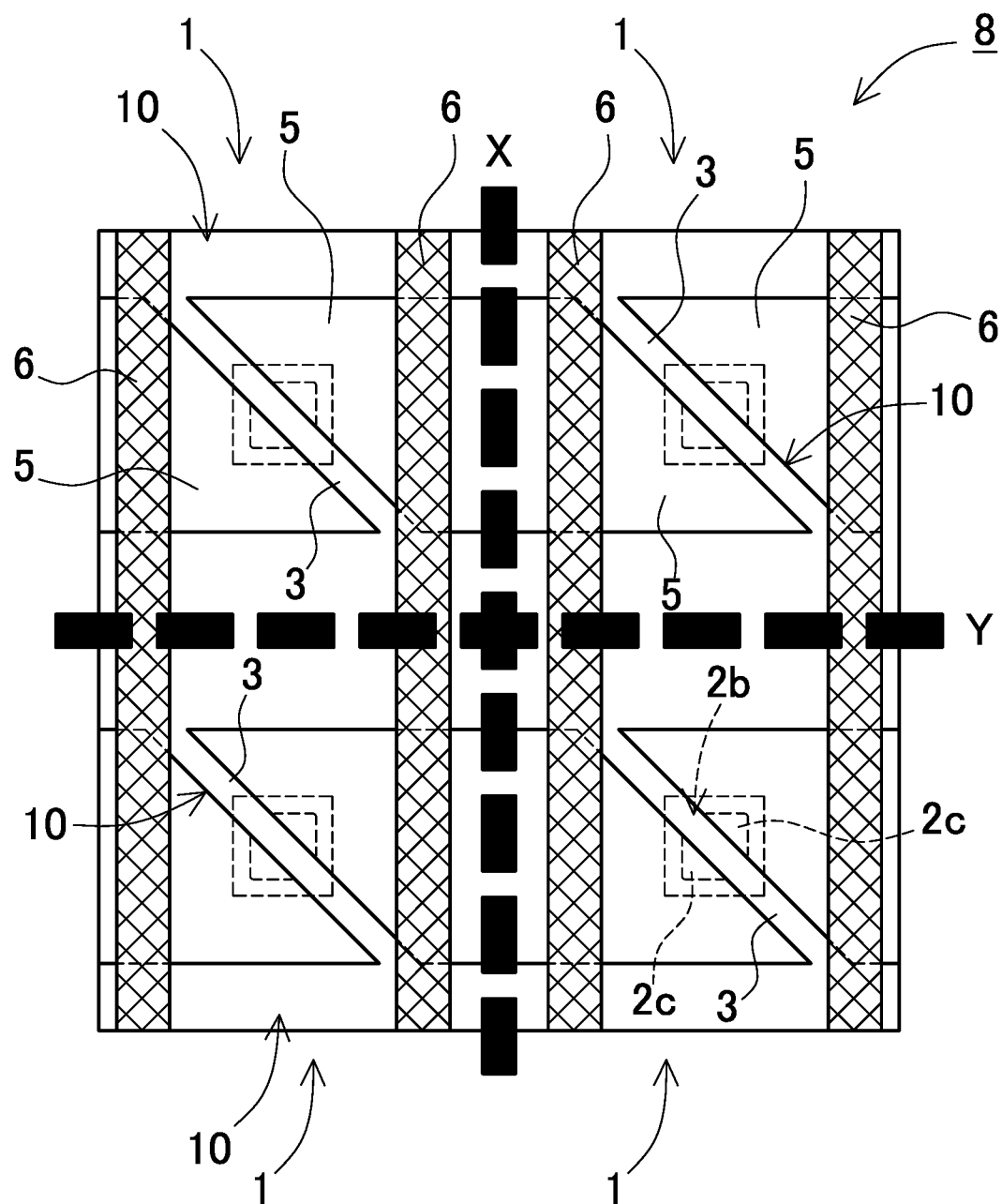
FIG. 5 is a schematic top view of a light emitting device according to another embodiment.

A light emitting device 1 according to a second embodiment is different in shape of electrode terminals 6 from the light emitting device 1 of the first embodiment. As shown in the plan view of FIG. 5, electrode terminals 6 different from those in the first embodiment are respectively formed on the surfaces of electrode layers 5 by performing screen printing. In the screen printing, an electrically conductive paste is applied to a specific position on an electrode layer 5, and thereafter cured to form the electrode terminals 6. According to the light emitting device 1 of this embodiment, a metal layer 9 is formed by a step identical to or similar to the step in the first embodiment, and thereafter the metal layer 9 is irradiated with laser light to divide the metal layer 9. An insulating region 10 created by applying laser light, and the electrode terminals 6 are different from those in the first embodiment. The laser light is applied along a region dividing a metal layer into a pair of electrode layers 5, and opposed two upper and lower sides of the light emitting device 1 on the plane of the drawing. The metal layer 9 is removed by the laser light irradiation, so that the slit-like insulating region 10 is created to divide the electrode layer 5. As shown in FIG. 5, the upper edge and the lower edge of the light emitting device 1 as seen on the plane of this drawing configure as the insulating region 10 obtained by removing the metal layer 9.

As the slit-like insulating region 10 formed by removing the metal layer 9, an inclined slit 10a extending in an orthogonal direction from the central portion of an electrode-formed surface 2b is created in the light emitting device 1 in FIG. 5. Further, parallel slits 10b connected to both end portions of the inclined slit 10a. The parallel slits 10b are parallel to each other, and extend along the outer edge of two opposed sides of the quadrangular electrode-formed surface 2b (e.g., two upper and lower sides of each light emitting device 1 in the drawing). The connection angle (a) between the inclined slit 10a and the parallel slit 10b is an acute angle, and the connection portion between the inclined slit 10a and the parallel slit 10b is positioned at a corner portion of a covering member 3. In the light emitting device 1, the right-triangular or trapezoidal electrode layer 5 having a shape extending in a direction crossing the parallel slit 10b is provided at each of both lateral portions of the quadrangular covering member 3 in FIG. 5, and a pair of electrode terminals 6 is disposed at both sides of the inclined slit 10a.

In the light emitting device 1 in FIG. 5, electrode terminals 6 each having a predetermined width are provided on both sides of the electrode-formed surface 2b. The electrode terminals 6 disposed on both sides of a cut line Y are each provided in a continuous band shape. These electrode terminals 6 are cut and separated by the cut line Y. The adjacent electrode terminals disposed on both sides of the cut line Y may be provided in a state of being separated from each other at an interval (not shown), and the intermediate body may be cut along the cut line Y between these electrode terminals. In this case, the distance between the separated electrode terminals is preferably larger than the cut width of the cut line Y. This light emitting device has electrode terminals disposed away from the outer edge to the inner side, thus the electrode terminal is not cut in a step of cutting the intermediate body along the cut line Y. Therefore, in this light emitting device, adverse effects such as damage to the electrode terminals 6 and the electrode layer 5, or detachment of the electrode terminal 6 and the electrode layer 5, can be reduced in a step of cutting the intermediate body along the cut line Y.

Third Embodiment

Figure 6:
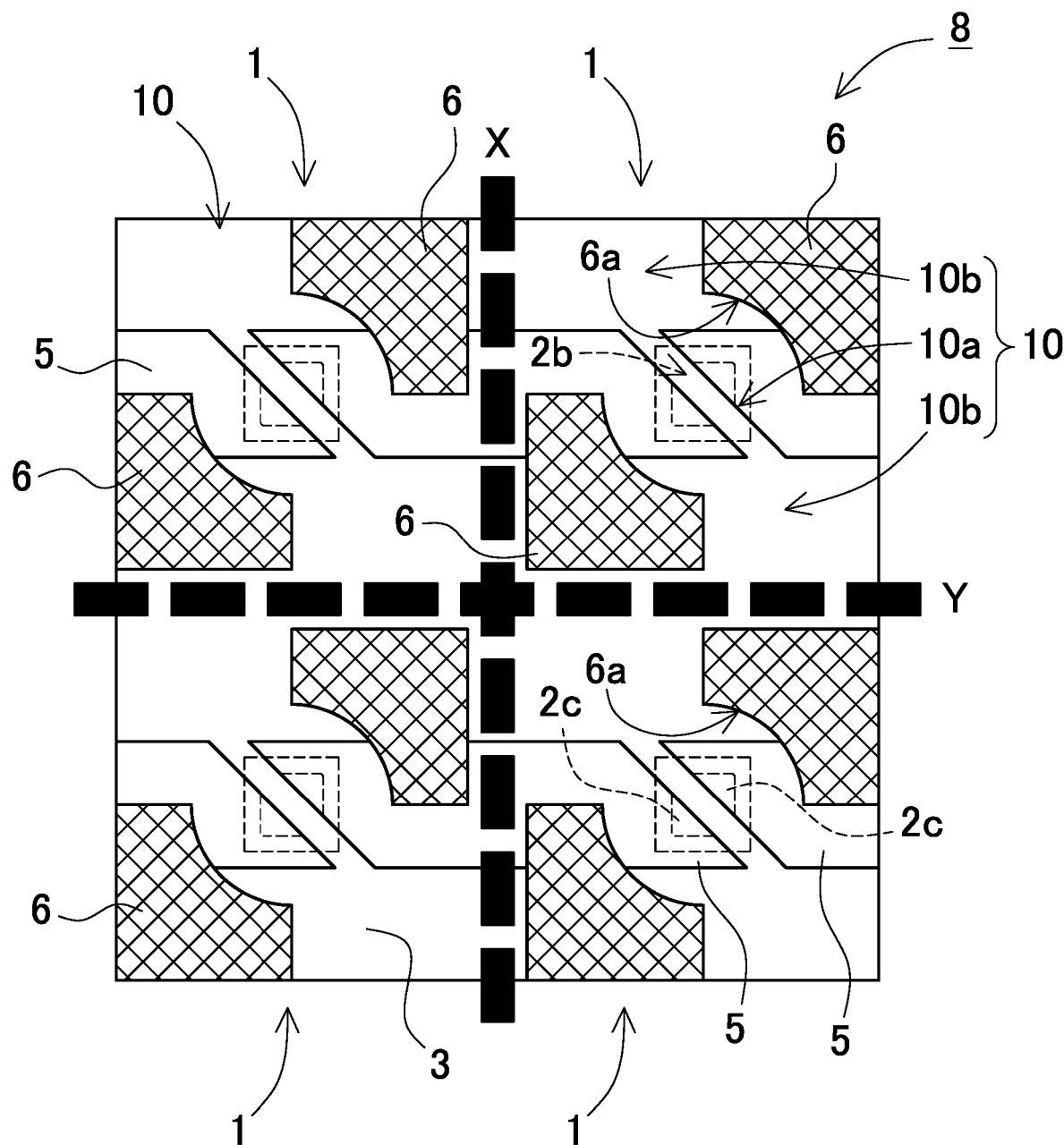
FIG. 6 is a schematic top view of a light emitting device according to another embodiment.

A light emitting device 1 according to a third embodiment includes an electrode layer 5 having a shape different from that in the second embodiment as shown in the plan view of FIG. 6. In the light emitting device 1 of this embodiment, a metal layer 9 is divided by laser light irradiation as in the case of the light emitting device 1 shown in FIG. 5, but the light emitting device 1 of this embodiment is different from the light emitting device 1 of the second embodiment in the width of each of parallel slits 10b formed along opposed two upper and lower sides of the light emitting device 1 as seen on the plane of this drawing. In the light emitting device 1 shown in FIG. 6, the width of each of parallel slits 10b connected to both end portions of an inclined slit 10a is larger than the width of the inclined slit 10a which extends in a diagonal direction from the central portion of an electrode-formed surface 2b. In other words, the width of each of electrode layers 5 (i.e., width in vertical direction in the drawing) formed so as to face each other on both sides of a quadrangular electrode-formed surface 2b and having a trapezoidal shape in a plan view is smaller than the width of each of the electrode layers 5 shown in the second embodiment. The vertical width of the electrode layer 5 shown in the drawing is larger than the length of one side of a light emitting element 2 so that an electrode post 2c of the electrode-formed surface 2b can be covered, and the vertical width of the electrode layer 5 is not larger than ½ times the length of one side of the light emitting device 1. Further, the light emitting device 1 shown in FIG. 6 includes electrode terminals 6 respectively disposed in regions which are opposed corner portions of a quadrangular covering member 3, and exclude the central portion of the covering member 3. These electrode terminals 6 have the same shape as the shape of the electrode terminals 6 shown in FIG. 4. As shown in the drawing, a pair of electrode terminals 6 are respectively disposed at opposed corner portions of the covering member 3, and at positions symmetric with respect to a point. The electrode terminals 6 each straddle the electrode layer 5 and the surface of the covering member 3.

Light Emitting Modul 1

The light emitting device manufactured in the above steps can be mounted on a light guiding plate in the following step to obtain a light emitting module.

As shown in the sectional view of FIG. 7, a light emitting module 11 includes the light emitting devices 1 each mounted in a recessed portion 7a provided on a light-transmissive light guiding plate 7. The recessed portions 7a are created on a second principal surface 7d on a side opposite to a first principal surface 7c of the light guide plate 7. The second principal surface 7d serves as a light emitting surface which radiates light to the outside. The light guiding plate 7 has a plurality of recessed portions 7a at predetermined pitches. The light emitting device 1 is mounted in each of the recessed portions 7a. The light emitting module 11 uniformly emits light from the first principal surface 7c by the plurality of light emitting devices 1 respectively mounted in the plurality of recessed portions 7a of the light guiding plate 7.

Light Guiding Plate

The light guiding plate 7 is a light-transmissive member through which light being incident from a light source exits as a surface light emission. The light guiding plate 7 in FIG. 7 has the second principal surface 7d on which a plurality of recessed portions 7a and V-shaped grooves 7e are created. The V-shaped grooves 7e are positioned between adjacent recessed portions 7a. The plurality of light emitting devices 1 are respectively mounted in the plurality of recessed portions 7a of the light guide plate 7 to configure the light emitting module 11. Alternatively, one light emitting device is disposed on a light guiding plate 7 with one recessed portion to obtain a light emitting bit, and a plurality of light emitting bits is disposed in a plane to obtain a light emitting module (not shown). In the light guiding plate 7, grid-like V-shaped grooves 7e are created between the recessed portions 7a as shown in FIG. 7.

In the V-shaped groove 7e, a light-reflective member 14 described later is provided. The light-reflective member 14 provided in the V-shaped groove 7e is preferably formed using a light reflective white resin. The light-reflective member 14 formed using a white resin allows light emitted from the light emitting device 1 to alleviate to enter an adjacent portion of the light guiding plate 7 separated by the V-shaped groove 7e. This can alleviate leakage of light from each light emitting device 1 to the adjacent light emitting device.

The size of the light guiding plate 7 is set to a suitable size according to the number of recessed portions 7a. For example, the light guiding plate 7 with a plurality of recessed portions 7a may be about 1 cm to 200 cm on a side, and is preferably about 3 cm to 30 cm on a side. The thickness of the light guiding plate 7 may be about 0.1 mm to 5 mm, and is preferably 0.5 mm to 3 mm. The planar shape of the light guiding plate 7 may be, for example, a substantially rectangular shape, a substantially circular shape or the like.

As a material for the light guiding plate 7, a resin material such as a thermoplastic resin such as acrylic, polycarbonate, a cyclic polyolefin, polyethylene terephthalate or polyester, a thermosetting resin such as epoxy or silicone, or an optically transparent material such as glass can be used. In particular, a thermoplastic resin material is preferable because the light guiding plate can be efficiently manufactured by injection molding. In particular, polycarbonate which has high transparency and is inexpensive is preferable. For the light emitting module 11 which is manufactured without being exposed to a high-temperature environment as in reflow soldering in a manufacturing process, it is possible to use even a material which is thermoplastic and has low heat resistance, such as polycarbonate.

The light guiding plate 7 can be molded by, for example, injection molding or transfer molding. The light guiding plate 7 can be provided by forming a material into a shape with recessed portions 7a using a mold, which enables mass-production at low cost with less displacement of the recessed portions 7a. Alternatively, the light guiding plate 7 can also be provided with recessed portions 7a by performing cutting processing with a NC processor or the like after molding a material into a plate shape.

The light guiding plate of the light emitting module of this embodiment may be formed by a single layer, or formed by stacking a plurality of light-transmissive layers. When a plurality of light-transmissive layers is stacked, it is preferable that a layer having a different refractive index (e.g., a layer of air) is provided between appropriately-selected layers. Accordingly, light is more easily diffused, so that a light emitting module with less luminance non-uniformity can be obtained. Such a configuration can be attained by, for example, providing spacers between appropriately-selected light-transmissive layers to separate the layers from each other, and providing a layer of air. A layer having a different refractive index (e.g., a layer of air) may be provided between a first principal surface 7c of the light guiding plate 7 and a light-transmissive layer, the light-transmissive layer being provided above the first principal surface 7c of the light guiding plate 7. Accordingly, light is more easily diffused, so that a liquid crystal display device with less luminance non-uniformity can be obtained. Such a configuration can be attained by, for example, providing a spacer between a light guiding plate and light-transmissive layer to separate the plate and the layer from each other, and providing a layer of air.

The light guiding plate 7 has an optically functional portion 7b provided on the first principal surface 7c side. The optically functional portion 7b has functions of reflecting and diffusing light from the light emitting device 1. The light guiding plate 7 can laterally spread light from the light emitting device 1 to make the light emission intensity even in the surface of the light guiding plate 7. The optically functional portion 7b can have a function of, for example, spreading light in the surface of the light guiding plate 7. The optically functional portion 7b is, for example, a depression provided on the first principal surface 7c side, and for example, has a polygonal pyramid shape such as a circular cone shape, a quadrangular pyramid shape or a hexagonal pyramid shape, a truncated circular cone shape (see FIG. 7) or truncated polygonal pyramid shape. Accordingly, it is possible to use a material which reflects light in a lateral direction of a light emitting element 2 at an interface between the light guiding plate 7 and a material having a different refractive index (e.g. air) existing in the optically functional portion 1a and an inclined surface of the depression. In addition, for example, a light-reflective material (e.g. a reflecting film of a metal or the like or a white resin) provided in a depression having an inclined surface may be used. The inclined surface of the optically functional portion 7b may be a flat surface or a curved surface in sectional view. Further, the depth of the depression which is the optically functional portion 7b is determined in consideration of the depth of the recessed portion 7a. That is, the depth of the optically functional portion 7b and the depth of the recessed portion 7a can be appropriately set as long as the optically functional portion 7b and the recessed portion 7a are separated from each other.

Figure 8A:
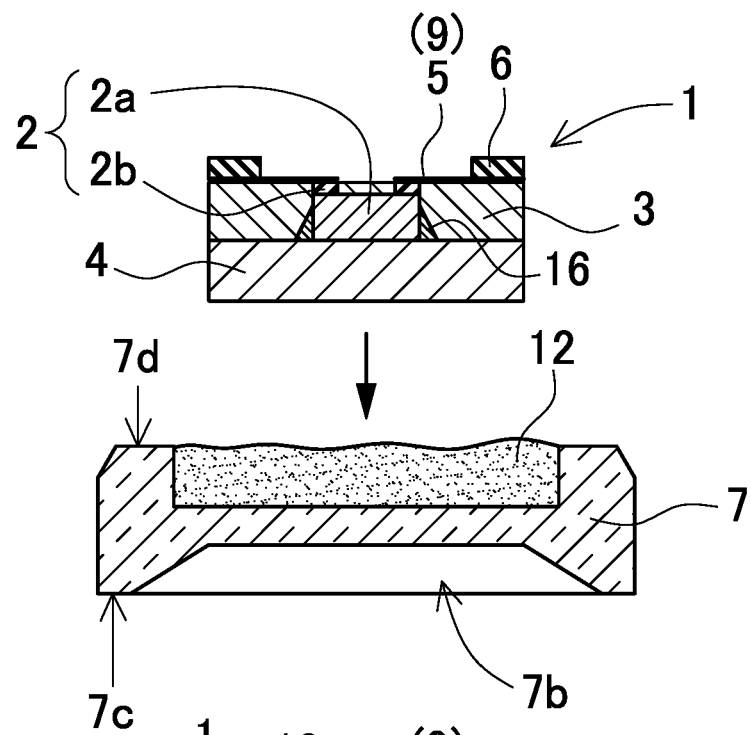
FIGS. 8A to 8C are schematic sectional view showing steps of manufacturing a light emitting module according to certain embodiment.
Figure 8B:
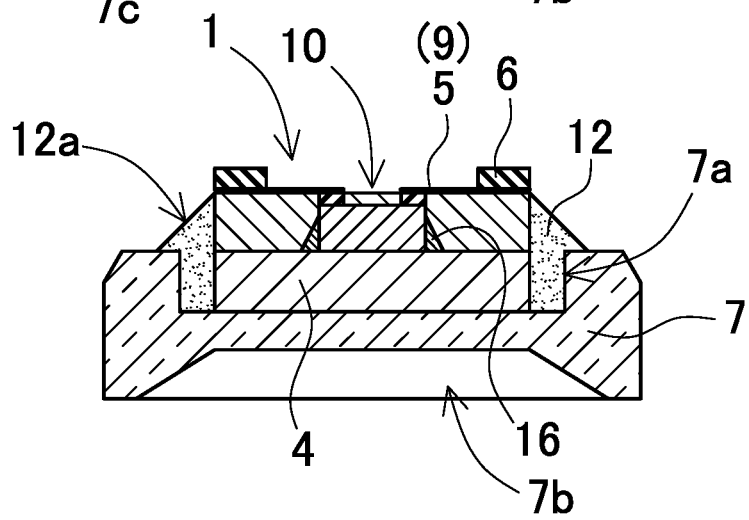

The light emitting device 1 is mounted in the recessed portion 7a of the light guiding plate 7 in the step shown in FIGS. 8 and 9. As shown in FIGS. 8A and 8B, the light guiding plate 7 is provided by molding a thermoplastic resin such as polycarbonate, and includes the recessed portion 7a formed on a second principal surface 7d, and the truncated circular cone-shaped optically functional portion 7b provided on a first principal surface 7c. The light emitting device 1 is bonded to the recessed portion 7a of the light guiding plate 7.

Part of the light emitting device 1 on the light emitting surface side, in other words, the light-transmissive member 4 in the drawing, is inserted into the recessed portion 7a in which a liquid light-transmissive is supplied, and bonding member 12 in an uncured state, and the light-transmissive bonding member 12 is cured to bond the light emitting device 1 to the light guiding plate 7. The light emitting device 1 is bonded to the light guiding plate 7 by accurately inserting the light-transmissive bonding member 12 into the center of the recessed portion 7a, and curing the light-transmissive bonding member 12. At the time of bonding the light emitting device 1 to the light guiding plate 7, the uncured light-transmissive bonding member 12 supplied to the recessed portion 7a is extruded and filled in the recessed portion 7a. It should be noted that the uncured light-transmissive bonding member can be supplied into the recessed portion 7a after the light emitting device 1 is bonded to the light guiding plate 7.

The light-transmissive bonding member 12 for bonding the light-transmissive member 4 to the bottom surface of the recessed portion 7a is brought into contact with the surface of the light-transmissive member 4 and the surface of the recessed portion 7a in an uncured state, and cured to bond the surface of the light-transmissive member 4 to the bottom surface of the recessed portion 7a. Further, the light-transmissive bonding member 12 extruded from a gap between the light-transmissive member 4 and the bottom surface of the recessed portion 7a bonds the outer lateral surfaces of the light-transmissive member 4 to the inner lateral surfaces of the recessed portion 7a. In this manufacturing method, the uncured liquid light-transmissive bonding member 12 supplied into the recessed portion 7a is extruded to the inside of the recessed portion 7a to perform the bonding. In this method, the light-transmissive bonding member 12 supplied into the recessed portion 7a serves a bonding agent.

The amount of the light-transmissive bonding member 12 applied to the inside of the recessed portion 7a is adjusted, so that the light-transmissive bonding member 12 is extruded to the outside of the recessed portion 7a from a gap between the inner lateral surfaces of the recessed portion 7a and the outer lateral surfaces of the light emitting device 1. The light-transmissive bonding member 12 extruded from the recessed portion 7a rises until coming into contact with the lateral surface of the covering member 3, and covers the lateral surface of the covering member 3. Further, the light-transmissive bonding member 12 spreads until coming into contact with the second principal surface 7d, and covers part of the second principal surface 7d. In this state, as the upper surface of the light-transmissive bonding member 12, an inclined surface 12a extending outward from the upper end portion of the light emitting device 1 is formed in vertical sectional view. Accordingly, light incident to the inclined surface 12a through the light-transmissive bonding member 12 can be reflected to the light emitting surface side in a uniform state. The inclined surface 12a of the light-transmissive bonding member 12 forms an acute angle with the outside surface of the covering member 3, with the inclination angle β being preferably 5° to 85°.

Figure 10:
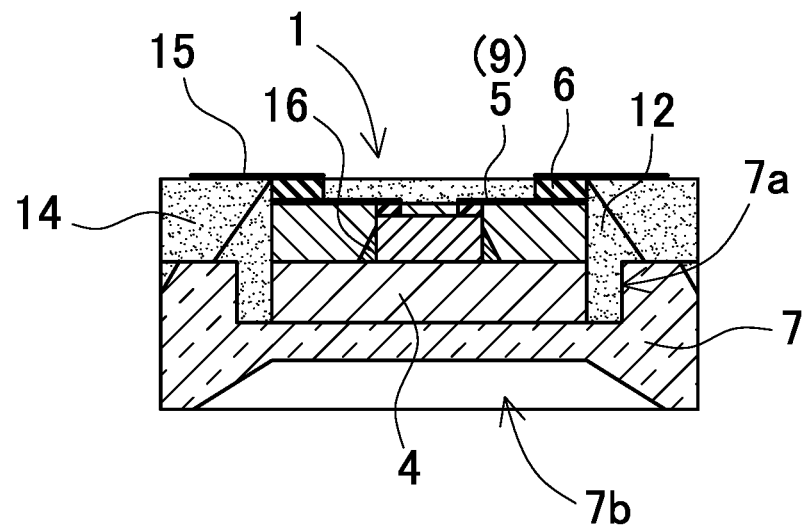
FIG. 10 is a partially enlarged schematic sectional view of a light emitting module according to another embodiment.

Further, the light-transmissive bonding member 12 may rise until coming into contact with the lateral surfaces of the electrode terminals 6, and cover the lateral surfaces of the covering member and the electrode terminals 6. The light-transmissive bonding member 12 shown in FIG. 10 covers the entire outer lateral surfaces of the electrode terminals 6. This can increase the surface area of the inclined surface 12a, so that a larger amount of light can be reflected. The light-transmissive bonding member 12 may cover surfaces of the electrode layer 5 and the insulating region 10 in a region other than a region where the electrode terminal 6 is provided.

Figure 11:
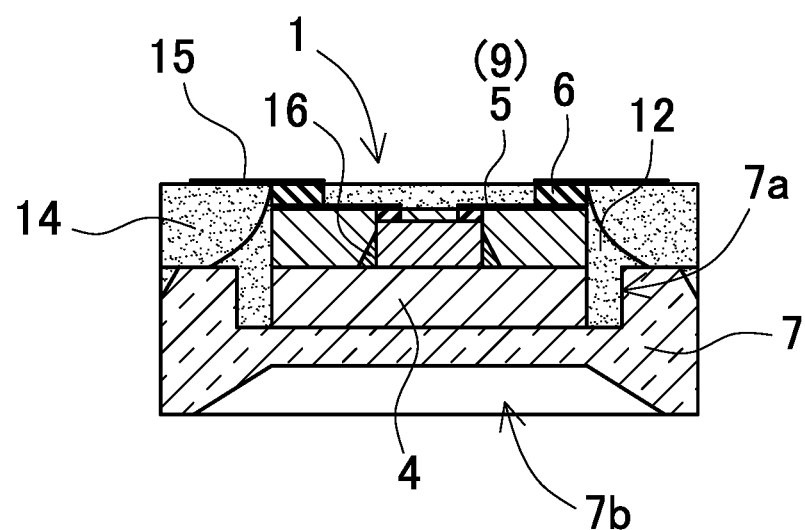
FIG. 11 is a partially enlarged schematic sectional view of a light emitting module according to another embodiment.

The inclined surface 12a of the light-transmissive bonding member 12 may be a curved surface in sectional view. The inclined surfaces 12a of the light-transmissive bonding member 12 shown in FIG. 11 are curved surfaces projected toward the recessed portion 7a side. The inclined surface 12a can expand the advancing direction of reflected light at the inclined surface 12a to reduce luminance non-uniformity.

An inclined surface 14a of the bonding member 14 shown in FIG. 11 covers the light guiding plate 7 up to further outside of the second principal surface 7d as compared to the state shown in FIG. 7. Specifically, it is preferable that the light-transmissive bonding member 12 covers larger surface area of the second principal surface 7d in sectional view. It should be noted that, when one light guiding plate 7 has a plurality of light emitting devices 1, it is preferable that the light-transmissive bonding member 12 is not in contact with the light-transmissive bonding member 12 covering the adjacent light emitting device 1.

This can increase the surface area of the inclined surface 12a, so that a larger amount of light can be reflected. The inclined surfaces 12a of the light-transmissive bonding member 12 shown in this drawing are curved surfaces projected toward the recessed portion 7a side in sectional view. This can diffuse the reflected light in a wide area, thereby reducing luminance non-uniformity.

In the drawing, the light-transmissive member 4 transmits light entering from the light emitting element 2, so that the light enters to the light guiding plate 7 on which the light emitting device 1 is mounted. For the purpose of thinning the light emitting module 11, it is preferable that as shown in the drawing, the light-transmissive member 4 is inside the recessed portion 7a of the light guiding plate 7 on which the light emitting device 1 is mounted, where the light-transmissive member 4 is disposed in the recessed portion 7a without protruding from the plane flush with the second principal surface 7d to the surface side. The light-transmissive member 4 in FIG. 7 has a thickness substantially equal to the depth of the recessed portion 7a, and has a surface flush with the second principal surface 7d. It should be noted that not shown in drawings, the light-transmissive member 4 may be disposed inside the recessed portion, and have such a thickness that the light-transmissive member 4 slightly protrudes from a plane flush with the second principal surface of the light guiding plate 7 to the surface side.

Figure 8C:
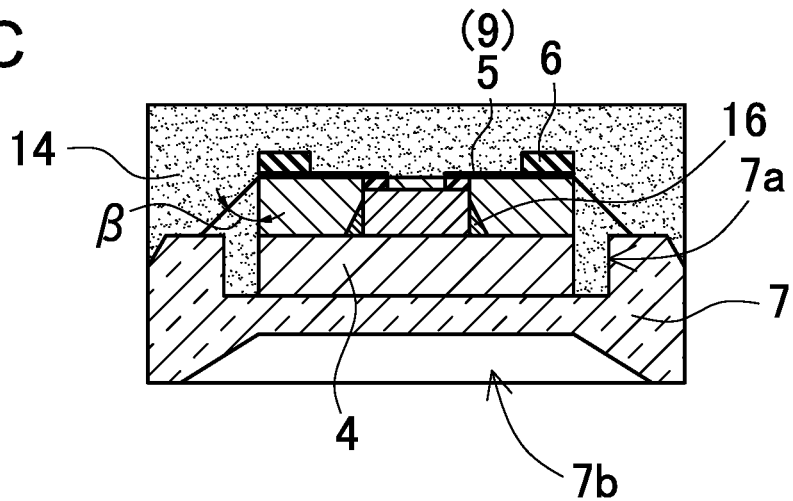

After the light emitting device 1 is bonded to the recessed portion 7a of the light guiding plate 7, the light-reflective member 14 is formed on the second principal surface 7d of the light guiding plate 7 in the step shown in FIG. 8C. For the light-reflective member 14, a white resin is used, and the light-reflective member 14 is formed so as to have a thickness allowing the light emitting device 1 to be embedded in the light-reflective member 14. The light-reflective member 14 is brought into contact with the lateral surfaces of the light emitting device 1 embedded, so that light emitting devices 1 adjacent to each other are fixed together in an insulated state.

Figure 9A:
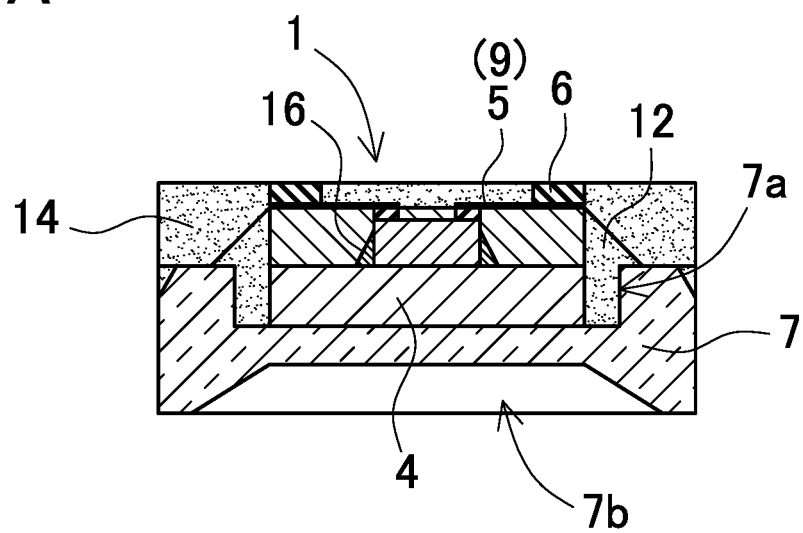
FIGS. 9A to 9B are schematic sectional view showing steps of manufacturing a light emitting module according to certain embodiment.

In the step shown in FIG. 9A, the surface of the cured light-reflective member 14 is polished to expose the electrode terminal 6 to the surface.

Figure 9B:
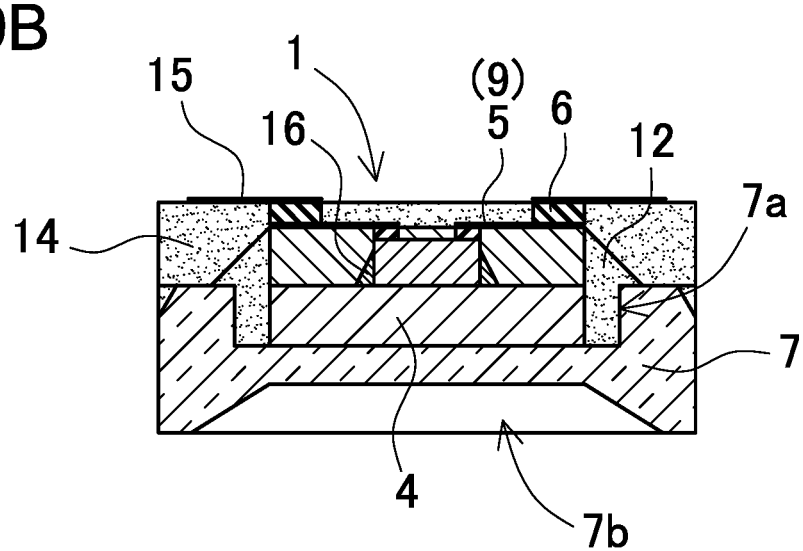

In the step shown in FIG. 9B, an electrically conductive film 15 is formed on the surface of the light-reflective member 14. In this step, a metal film of Cu/Ni/Au is formed on the electrode terminal 6 of the light emitting device 1 and the light-reflective member 14 by printing, sputtering or the like.

Figure 12:
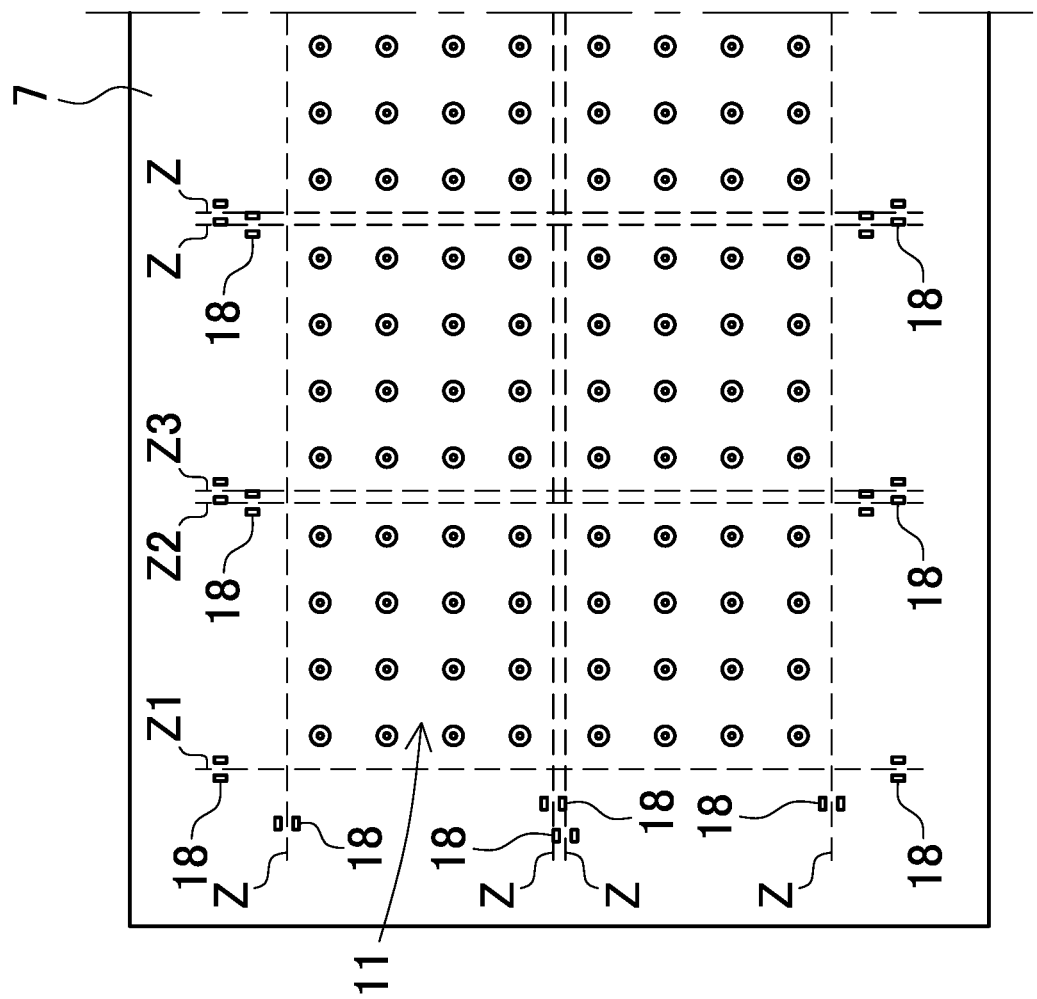
FIG. 12 is a schematic top view of a light emitting module according to certain embodiment.

A plurality of light emitting devices 1 may be arranged so as to be driven independently of one another. As illustrated in FIG. 12, the light emitting module may include a plurality of light emitting device groups, where the light guiding plate 7 is demarcated into a plurality of areas, a plurality of light emitting devices 1 mounted within one area is assumed as one group, and a plurality of light emitting devices 1 in the group is electrically connected to one another in series or in parallel, and connected to the same circuit. By arranging the light emitting devices into groups, the light emitting module 11 can be obtained in which local dimming is possible. In FIG. 12, a plurality of light emitting modules 11 is arranged on the light guiding plate 7, and a pair of alignment marks 18 is provided outside the light emitting modules 11. The pair of alignment marks 18 is provided as, for example, two hollows separated from each other. By cutting the light guiding plate 7 along cut lines Z extending between the two hollows, for example, along cut lines Z1, Z2 and Z3 in this order, the light guiding plate 7 can be divided into the light emitting modules 11. The light emitting module 11 has light emitting devices 1 arranged in a matrix of four rows and four columns.

One light emitting module 11 may be used as a backlight for one liquid crystal display device. In addition, a plurality of light emitting modules may be arranged, and used as a backlight for one liquid crystal display device. When a plurality of small light emitting modules is prepared, and each subjected to inspection or the like, the yield can be improved as compared to a case where a large light emitting module having a large number of light emitting devices mounted therein is prepared.

One light emitting module 11 may be bonded to one wiring substrate. A plurality of light emitting modules 11 may be bonded to one wiring substrate. Accordingly, terminals for electrical connection to the outside (e.g., connectors) can be integrated. That is, it is not necessary to prepare a terminal for each light emitting module. Therefore the structure of a liquid crystal display device can be simplified.

A plurality of wiring substrates, each of which is bonded to a plurality of light emitting modules, may be arranged, and used as a backlight for one liquid crystal display device. In this case, for example, a plurality of wiring substrates can be placed on a frame or the like, and each connected to an external power source using a connector or the like.

A light-transmissive member having a function of diffusion or the like may be further stacked on the light guiding plate 7. In this case, when the optically functional portion 7b is a depression, it is preferable that the opening, which is a portion close to the first principal surface 7c of the light guiding plate 7 of the depression is closed, or a component having light transmissivity is provided in such a manner that the depression is not filled. Accordingly, a layer of air can be provided in the depression of the optically functional portion 7b, so that light from the light emitting device 1 can be favorably spread.

While some embodiments according to the present disclosure have been shown above, it is needless to say that the present disclosure is not limited to the aforementioned embodiments, and any change or modification may be included in the scope of the present disclosure unless departing from the spirit of the present disclosure.

The disclosure of this specification may include the following aspects.

Aspect 1

A light emitting device including:

a light emitting element 2 having an electrode-formed surface on which a pair of electrode posts 2c is formed;

a covering member 3 covering the electrode-formed surface 2b of the light emitting element 2 while forming an exposure portion of each of the electrode posts 2c which is exposed from the covering member 3;

a pair of electrode layers 5 provided on a surface of the covering member 3, and electrically connected to the exposure portions of the electrode posts 2c; and a pair of electrode terminals 6 electrically connected to the electrode layers 5, and provided on the surface of the covering member 3, in which the pair of electrode terminals 6 is thicker than the electrode layer 5, and is disposed at an interval larger than an interval between a pair of electrode posts 2c.

Aspect 2

The light emitting device according to aspect 1, in which the electrode-formed surface 2b of the light emitting element has a quadrangular shape, and the pair of electrode terminals 6 is disposed at symmetric positions on the outer edge of the electrode-formed surface 2b.

Aspect 3

The light emitting device according to aspect 1 or 2, in which the electrode-formed surface 2b of the light emitting element 2 has a quadrangular shape, the electrode-formed surface 2b is provided with an insulating region 10 having no electrode layer 5, and the insulating region 10 is an inter-electrode slit.

Aspect 4

The light emitting device according to aspect 3, in which the inter-electrode slit as the insulating region 10 formed on the electrode-formed surface 2b has an inclined slit 10a extending in a diagonal direction from the central portion of the electrode-formed surface 2b.

Aspect 5

The light emitting device according to aspect 4, in which the inter-electrode slit as the insulating region 10 has parallel slits 10b respectively connected to end portions of the inclined slit 10a, and the parallel slits 10b are parallel to each other, and extend in a direction parallel to two opposed sides of the electrode-formed surface 2b.

Aspect 6

The light emitting device according to aspect 5, in which the angle formed by the inclined slit 10a and one of the parallel slits 10b is an obtuse angle, and the electrode layer 5 is provided on each of both sides of the slit, and has a wide portion 5A and a narrow portion 5B.

Aspect 7

The light emitting device according to aspect 5 or 6, in which the pair of electrode terminals 6 has an elongated shape extending in the extending direction of the parallel slits 10b.

Aspect 8 The light emitting device according to aspect 5 or 6, in which the pair of the electrode terminals 6 is disposed in regions which are opposed corner portions of the covering member, and exclude the central portion of the electrode-formed surface 2b.

Aspect 9

The light emitting device according to aspect 6, in which the pair of electrode terminals is respectively disposed in regions which are corner portions facing each other in the quadrangular electrode-formed surface, and exclude the central portion of the electrode-formed surface, and the electrode posts are disposed at the central portion of the electrode-formed surface.

Aspect 10

The light emitting device according to any one of aspects 1 to 9, in which a thickness of the electrode terminal 6 is not less than 10 times a thickness of the electrode layer 5.

Aspect 11

A light emitting module including:

the light emitting device 1 according to any one of aspects 1 to 10; and a light-transmissive light guiding plate 7 having a second principal surface 7d on which a recessed portion 7a is formed on a side opposite to a first principal surface 7c serving as a light emitting surface from which light exits, the light emitting device 1 being disposed in the recessed portion 7a of the light guiding plate 7.

Aspect 12

A method of manufacturing a light emitting device, including:

providing an intermediate body 8 in which a light emitting element 2 including a pair of electrode posts 2c formed on an electrode-formed surface 2b is covered with a covering member 3, and the covering member 3 forms exposure portions of the electrode posts 2c in which the electrode posts 2c are exposed from the covering member 3;

forming a pair of electrode layers 5 on a surface of the covering member 3, the pair of electrode layers 5 being electrically connected to the exposure portions of the electrode posts 2c in the intermediate body 8; and providing a pair of electrode terminals 6, which is electrically connected to a pair of electrode layers 5 and which is thicker than the electrode layer 5, so as to be disposed at an interval larger than an interval between a pair of electrode posts 2c.

Aspect 13

The method of manufacturing a light emitting device as according to aspect 12, in which the electrode layer 5 is formed using a metal thin film, and a metal paste is applied to a surface of the electrode layer 5 to provide the electrode terminals 6.

Aspect 14

The method of manufacturing a light emitting device as according to aspect 12 or 13, in which in the step of forming the electrode layer 5, the metal layer 9 is formed on the surface of the covering member 3, and the metal layer is separated into a plurality of electrode layers 5 by irradiating the metal layer 9 with laser light to remove part of the metal layer 9.

Aspect 15

A method of manufacturing a light emitting module, including:

providing the light emitting device manufactured by the method according to any one of aspects 12 to 14, and providing a light guiding plate 7 having a first principal surface 7c serving as a light emitting surface, and a second principal surface 7d on which a recessed portion 7a is formed, the second principal surface 7d being positioned on a side opposite to the first principal surface 7c;

bonding the light emitting device 1 to the recessed portion 7a;

providing a light-reflective member on the second principal surface 7d of the light guiding plate 7 so as to embed the light emitting device 1; and polishing the light-reflective member to expose the electrode terminals 6, and forming an electrically conductive film 15 on surfaces of the exposed electrode terminals 6.

The light emitting device of the present disclosure can be effectively used as a planar body.

It should be apparent to those with an ordinary skill in the art that while various preferred embodiments of the invention have been shown and described, the invention is not limited to the particular embodiments disclosed, which are deemed to be merely illustrative of the inventive concepts, and which are suitable for all modifications and changes falling within the scope of the invention as defined in the appended claims.

What is claimed is:

1. A light emitting device comprising:
   a light emitting element having an electrode-formed surface on which a pair of electrode posts are formed;
   a covering member covering the electrode-formed surface of the light emitting element while forming an exposed portion of each of the pair of electrode posts which are exposed from the covering member;
   a pair of electrode layers provided on a surface of the covering member and electrically connected to the exposed portions of the pair of electrode posts; and
   a pair of electrode terminals electrically connected to the pair of electrode layers, and provided on a surface of the electrode layers,
   wherein the pair of electrode terminals are thicker than the pair of electrode layers, and are disposed at an interval larger than an interval between the pair of electrode posts, wherein the electrode-formed surface of the light emitting element has a quadrangular shape,
   wherein the electrode-formed surface is provided with an insulating region having no electrode layer,
   wherein the insulating region forms an inter-electrode slit, and
   wherein the inter-electrode slit is the insulating region formed on the electrode-formed surface and has an inclined slit extending in a diagonal direction from a central portion of the electrode-formed surface.

2. The light emitting device according to claim 1, wherein the pair of electrode terminals are disposed at symmetric positions on the outer edge of the electrode-formed surface.

3. The light emitting device according to claim 2, wherein a thickness of the pair of electrode terminals is not less than 10 times a thickness of the pair of electrode layers.

4. The light emitting device according to claim 1, wherein the inter-electrode as the insulating region has parallel slits respectively connected to end portions of the inclined slit, and the parallel slits are parallel to each other, and extend in a direction parallel to two opposed sides of the electrode-formed surface.

5. The light emitting device according to claim 4, wherein an angle formed by the inclined slit and one of the parallel slits is an obtuse angle, and
   the pair of electrode layers are provided on each of both sides of the inclined slit, and have a wide portion and a narrow portion.

6. The light emitting device according to claim 5,
   wherein the pair of electrode terminals are respectively disposed in regions which are corner portions facing each other in the covering member, and exclude the central portion of the covering member, and
   wherein the pair of electrode posts are disposed at the central portion of the covering member.

7. The light emitting device according to claim 5, wherein a thickness of the pair of electrode terminals is not less than 10 times a thickness of the pair of electrode layers.

8. The light emitting device according to claim 4, wherein a thickness of the pair of electrode terminals is not less than 10 times a thickness of the pair of electrode layers.

9. The light emitting device according to claim 4, wherein the pair of electrode terminals have an elongated shape extending in the extending direction of the parallel slits.

10. The light emitting device according to claim 9, wherein a thickness of the pair of electrode terminals is not less than 10 times a thickness of the pair of electrode layers.

11. The light emitting device according to claim 4 wherein the pair of electrode terminals are disposed in regions which are opposed corner portions of the covering member, and exclude the central portion of the electrode-formed surface.

12. The light emitting device according to claim 1, wherein a thickness of the pair of electrode terminals is not less than 10 times a thickness of the pair of electrode layers.

13. A light emitting module comprising:
    the light emitting device according to claim 1; and
    a light-transmissive light guiding plate having a second principal surface on which a recessed portion is formed on a side opposite to a first principal surface serving as a light emitting surface from which light exits,
    wherein the light emitting device being disposed in the recessed portion of the light guiding plate.

14. The light emitting module according to claim 13, wherein
    the light emitting device has the pair of electrode terminals that are disposed at symmetric positions on the outer edge of the electrode-formed surface.

15. A light emitting module according to claim 13, wherein
    the light emitting device has the inter-electrode slit as the insulating region that has parallel slits respectively connected to end portions of the inclined slit, and
    the parallel slits are parallel to each other, and extend in a direction parallel to two opposed sides of the electrode-formed surface.

16. The light emitting module according to claim 15,
    wherein an angle formed by the inclined slit and one of the parallel slits is an obtuse angle, and
    wherein the pair of electrode layers are provided on each of both sides of the inclined slit, and have a wide portion and a narrow portion.

17. A method of manufacturing a light emitting device, the method comprising:
    providing an intermediate body in which a light emitting element including a pair of electrode posts formed on an electrode-formed surface is covered with a covering member, and the covering member forms exposure portions of the pair of electrode posts exposed from the covering member, the electrode-formed surface being a quadrangular shape and provided with an insulating region having no electrode layer and an inter-electrode slit being the insulating region formed on the electrode-formed surface and having an inclined slit extending in a diagonal direction from a central portion of the electrode-formed surface;

forming a pair of electrode layers on a surface of the covering member, the pair of electrode layers being electrically connected to the exposed portions of the pair of electrode posts in the intermediate body; and providing a pair of electrode terminals on a surface of the pair of electrode layers, which are electrically connected to the pair of the electrode layers and which are thicker than the pair of electrode layers, so as to be disposed at an interval larger than an interval between the pair of electrode posts.

18. The method of manufacturing a light emitting device according to claim 17, wherein the pair of electrode layers are formed using a metal thin film, and a metal paste is applied to a surface of the pair of electrode layers to provide the pair of electrode terminals.

19. The method of manufacturing a light emitting device according to claim 17, wherein in the step of forming the pair of electrode layers, a metal layer is formed on the surface of the covering member, and the metal layer is separated into a plurality of the electrode layers by irradiating the metal layer with laser light to remove part of the metal layer.

20. A method of manufacturing a light emitting module, comprising:

providing the light emitting device manufactured by the method according to claim 17, and providing a light guiding plate having a first principal surface serving as a light emitting surface, and a second principal surface on which a recessed portion is formed, the second principal surface being positioned on a side opposite to the first principal surface;

bonding the light emitting device to the recessed portion;

providing a light-reflective member on the second principal surface of the light guiding plate so as to embed the light emitting device; and polishing the light-reflective member to expose the electrode terminals, and forming an electrically conductive film on surfaces of the exposed electrode terminals.

* * * * *